United States Patent
Lin

(10) Patent No.: US 11,567,148 B2
(45) Date of Patent: Jan. 31, 2023

(54) MAGNETIC SENSOR

(71) Applicant: TDK Corporation, Tokyo (JP)

(72) Inventor: Chengbin Lin, Tokyo (JP)

(73) Assignee: TDK CORPORATION, Tokyo (JP)

( * ) Notice: Subject to any disclaimer, the term of this patent is extended or adjusted under 35 U.S.C. 154(b) by 405 days.

(21) Appl. No.: 16/615,062

(22) PCT Filed: May 21, 2018

(86) PCT No.: PCT/JP2018/019470
§ 371 (c)(1),
(2) Date: Nov. 19, 2019

(87) PCT Pub. No.: WO2018/216651
PCT Pub. Date: Nov. 29, 2018

(65) Prior Publication Data
US 2020/0191885 A1 Jun. 18, 2020

(30) Foreign Application Priority Data
May 23, 2017 (JP) .............................. JP2017-101542

(51) Int. Cl.
*G01R 33/09* (2006.01)
*G01R 33/07* (2006.01)
*G01R 33/00* (2006.01)

(52) U.S. Cl.
CPC ........ *G01R 33/072* (2013.01); *G01R 33/0011* (2013.01); *G01R 33/091* (2013.01); *G01R 33/093* (2013.01)

(58) Field of Classification Search
CPC ...... G01R 33/06; G01R 33/07; G01R 33/072; G01R 33/075; G01R 33/09; G01R 33/091;
(Continued)

(56) References Cited

U.S. PATENT DOCUMENTS 4,665,362 A * 5/1987 Abel .................. G01D 5/147
324/207.2
5,781,005 A * 7/1998 Vig .................. G01R 33/07
324/207.2
(Continued)

FOREIGN PATENT DOCUMENTS

EP 3 467 529 A1 4/2019
JP 5500785 B2 5/2014
WO 2017/082011 A1 5/2017

OTHER PUBLICATIONS

Extended European Search Report issued in corresponding European Patent Application No. 18805574.3-1010, dated Jan. 29, 2021.
(Continued)

*Primary Examiner* — David M Schindler
(74) *Attorney, Agent, or Firm* — McDermott Will & Emery LLP

(57) ABSTRACT

An object of the present invention is to reduce leakage magnetic flux in a magnetic sensor provided with a sensor substrate and an external magnetic member. A magnetic sensor includes: a sensor substrate having an element forming surface on which magnetic sensing elements are formed, first and second side surfaces, and a back surface; a first external magnetic member provided between the first and second magnetic sensing elements; and a second external magnetic member having first and second parts and covering the first side surface and second side surface, respectively. The first and second parts of the second external magnetic member protrude from the element forming surface. According to the present invention, since the first and second parts of the second external magnetic member protrude from the element forming surface, leakage of magnetic flux between the first and second external magnetic members is reduced.

11 Claims, 21 Drawing Sheets

(58) Field of Classification Search
CPC .. G01R 33/093; G01R 33/095; G01R 33/096; G01R 33/098; G01R 33/0011; G01D 5/142; G01D 5/145; G01D 5/147; G01D 5/16; G01D 5/165; G01B 7/14; G01B 7/30

See application file for complete search history.

(56) References Cited

U.S. PATENT DOCUMENTS

| | | | |
|---|---|---|---|
| 9,116,018 B2* | 8/2015 | Frachon | G01D 5/147 |
| 9,559,293 B2* | 1/2017 | Ausserlechner | G01R 33/072 |
| 2009/0284254 A1 | 11/2009 | Kasajima | |
| 2017/0059668 A1 | 3/2017 | Chang et al. | |
| 2018/0313907 A1* | 11/2018 | Fukui | G01R 33/0011 |

OTHER PUBLICATIONS

International Search Report issued in corresponding International Patent Application No. PCT/JP2018/019470, dated Jun. 26, 2018, with English translation.

* cited by examiner

MAGNETIC SENSOR

CROSS REFERENCE

This application is the US. National Phase under 35 § 371 of International Application. No. PCT/JP2018/019470, filed on May 21, 2018, which claims the benefit of Japanese Application No. 2017-101542, filed on May 23, 2017, the entire contents of each are hereby incorporated by reference.

TECHNICAL FIELD

The present invention relates to a magnetic sensor and, more particularly, to a magnetic sensor provided with a sensor substrate having a magnetic sensing element formed thereon and an external magnetic member.

BACKGROUND ART

A magnetic sensor using a magnetic sensing element is widely used in an ammeter, a magnetic encoder and the like. The magnetic sensor is sometimes provided with an external magnetic member for concentrating magnetic flux on the magnetic sensing element. For example, the magnetic sensor described in FIG. 8 of Patent Document 1 is provided with a magnetic member 21 that covers the center portion of the element forming surface of a sensor chip, a magnetic member 22 that covers the left side surface of the sensor chip, and a magnetic member 23 that covers the right side surface of the sensor chip and has magnetic sensing elements respectively between the magnetic members 21 and 22 and between the magnetic members 21 and 22 so as to distribute magnetic flux to the magnetic sensing elements.

CITATION LIST

Patent Document

[Patent Document 1] Japanese Patent No. 5,500,785

SUMMARY OF INVENTION

Problem to be Solved by the Invention

However, in the magnetic sensor described in Patent Document 1, an air gap between the magnetic members 21 and 22 or between the magnetic members 21 and 23 is large to increase leakage of magnetic flux, failing to obtain sufficient detection sensitivity.

It is therefore an object of the present invention to reduce leakage magnetic flux in a magnetic sensor having a sensor substrate and an external magnetic member to enhance detection sensitivity.

Means for Solving the Problem

A magnetic sensor according to the present invention includes: a sensor substrate having an element forming surface on which a plurality of magnetic sensing elements including first and second magnetic sensing elements are formed, a back surface positioned on the opposite side of the element forming surface, and first and second side surfaces substantially perpendicular to the element forming surface and the back surface and positioned opposite to each other; a first external magnetic member provided on the element forming surface and disposed between the first and second magnetic sensing elements; and a second external magnetic member having a first part covering the first side surface and a second part covering the second side surface. The first magnetic sensing element is positioned between the first external magnetic member and the first part of the second external magnetic member in a plan view, and the second magnetic sensing element is positioned between the first external magnetic member and the second part of the second external magnetic member in a plan view. The first and second parts of the second external magnetic member protrude from the element forming surface.

According to the present invention, the first and second parts of the second external magnetic member protrude from the element forming surface, so that leakage of magnetic flux between the first and second external magnetic members is reduced. This concentrates magnetic flux more on the magnetic sensing element, making it possible to enhance magnetic field detection sensitivity.

In the present invention, the protruding amount of the first and second parts from the element forming surface is preferably equal to or less than the distance between the first external magnetic member and each of the first and second parts of the second external magnetic member along the element forming surface. This reduces the magnetic flux that bypasses the magnetic sensing elements between the first and second external magnetic members, making it possible to enhance detection sensitivity.

In the present invention, the first and second parts of the second external magnetic member each preferably have a tapered shape in which the thickness thereof gradually increases from the element forming surface side toward the back surface side. This enhances magnetism collection effect more than when the first and second parts do not have the tapered shape.

In the present invention, the second external magnetic member preferably further has a third part that covers the back surface. This can further reduce a magnetic resistance.

In the present invention, the first and second parts of the second external magnetic member may be formed separately from each other, and the back surface of the sensor substrate may be exposed without being covered with the second external magnetic member. This allows reduction in size of the second external magnetic member.

In the present invention, the second external magnetic member preferably further has a first overhanging part bent toward the element forming surface side from the first part and a second overhanging part bent toward the element forming surface side from the second part. This further reduces leakage of magnetic flux between the first and second external magnetic members, concentrating magnetic flux more on the magnetic sensing element, making it possible to further enhance magnetic field detection sensitivity.

In this case, the first and second overhanging parts may each have a shape in which the width or thickness thereof is reduced toward the first external magnetic member. This reduces the magnetic flux that bypasses the magnetic sensing elements between the first and second external magnetic members, making it possible to further enhance detection sensitivity.

The magnetic sensor according to the present invention preferably further includes first, second and third magnetic layers formed so as to overlap the element forming surface of the sensor substrate in a plan view, the first magnetic sensing element is preferably provided on a magnetic path formed by a first gap between the first and second magnetic layers, the second magnetic sensing element is preferably provided on a magnetic path formed by a second gap between the first and third magnetic layers, and the first external magnetic member is preferably provided on the first magnetic layer. With this configuration, the first to third magnetic layers each serve as a magnetic path on the element forming surface of the sensor substrate, so that a magnetic resistance is significantly reduced, thus making it possible to further enhance detection sensitivity.

In this case, the first overhanging part preferably covers at least a part of the second magnetic layer, and the second overhanging part preferably covers at least a part of the third magnetic layer. This can further reduce a magnetic resistance.

In the present invention, all the plurality of magnetic sensing elements are preferably a magnetic resistance element.

Advantageous Effects of the Invention

According to the present invention, leakage of magnetic flux between the first and second external magnetic members is reduced, so that it is possible to enhance magnetic field detection sensitivity more than conventional magnetic sensors do.

MODE FOR CARRYING OUT THE INVENTION

Preferred embodiments of the present invention will be explained below in detail with reference to the accompanying drawings.

First Embodiment

Figure 1:
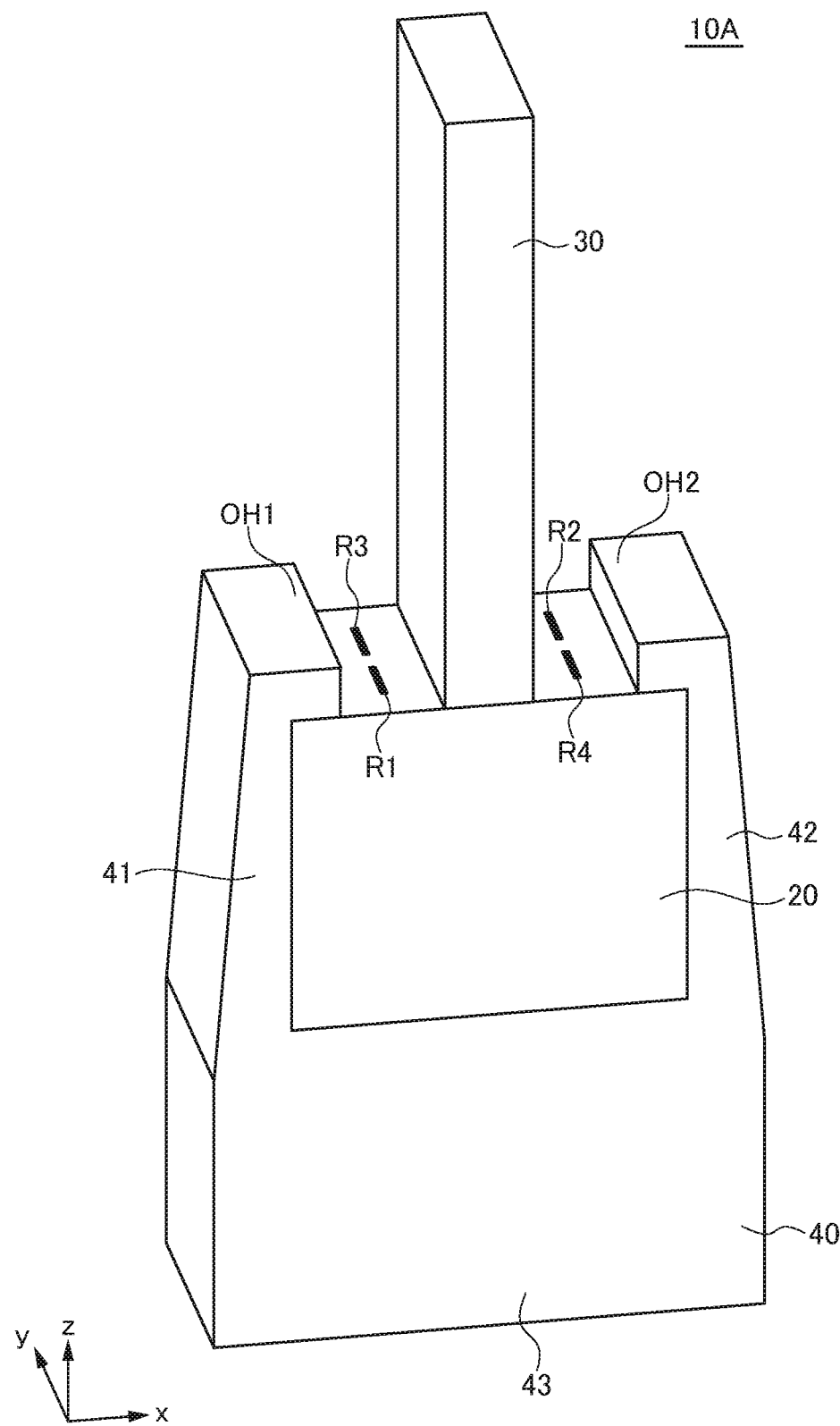
FIG. 1 is a schematic perspective view illustrating the outer appearance of a magnetic sensor 10A according to a first embodiment of the present invention.
Figure 2:
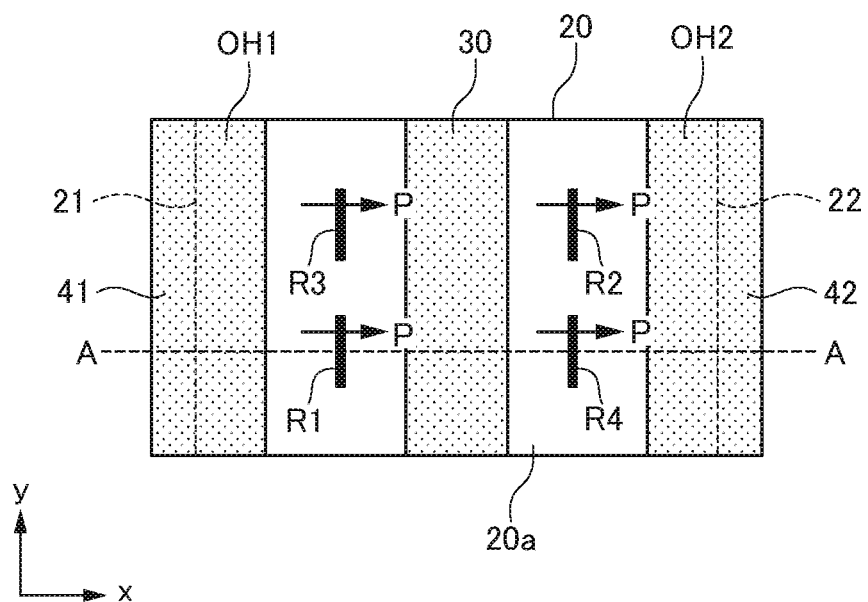
FIG. 2 is a schematic top view of the magnetic sensor 10A.

FIG. 1 is a schematic perspective view illustrating the outer appearance of a magnetic sensor 10A according to the first embodiment of the present invention. FIG. 2 is a schematic top view of the magnetic sensor 10A, and FIG. 3 is a schematic cross-sectional view taken along line A-A in FIG. 2.

Figure 3:
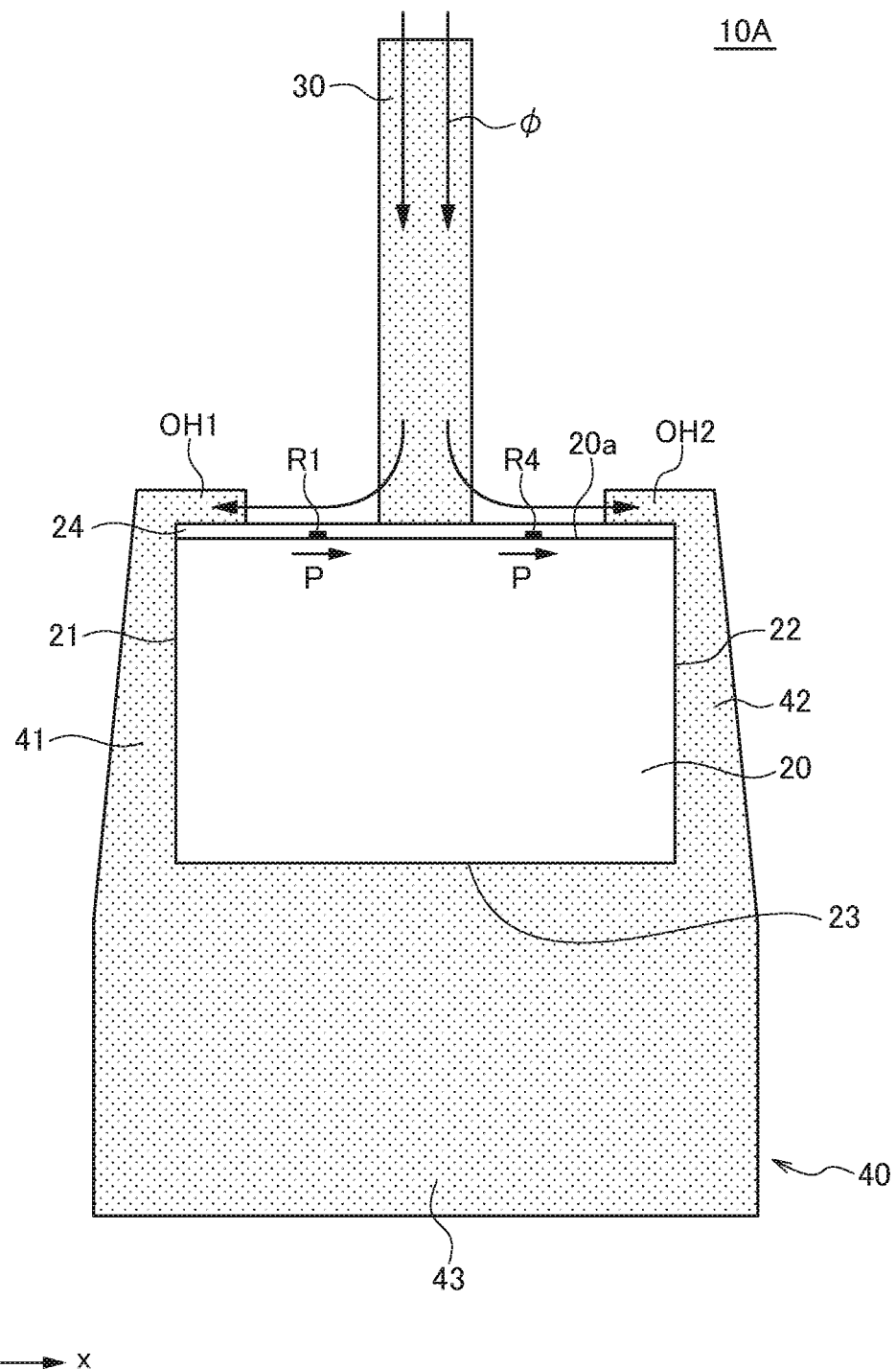
FIG. 3 is a schematic cross-sectional view taken along line A-A in FIG. 2.

As illustrated in FIGS. 1 to 3, the magnetic sensor 10A according to the present embodiment includes a sensor substrate 20 and first and second external magnetic members 30 and 40 added to the sensor substrate 20. The sensor substrate 20 is a chip component, and four magnetic sensing elements R1 to R4 are formed on an element forming surface 20a thereof. The sensor substrate 20 is generally produced by simultaneously forming a number of sensor substrates 20 in an aggregate substrate, followed by separation into multiple individual sensor substrates 20. However, the present invention is not limited to this, but individual sensor substrates 20 may be produced separately.

The first and second external magnetic members 30 and 40 are each a block made of a soft magnetic material having high permeability, such as ferrite. The first and second external magnetic members 30 and 40 may be bonded to the sensor substrate 20 by, e.g., an adhesive or may be mounted on not-shown another substrate together with the sensor substrate 20 such that the relative positional relationship with the sensor substrate 20 is fixed.

The sensor substrate 20 has a substantially rectangular parallelepiped shape, and the four magnetic sensing elements R1 to R4 are formed on the element forming surface 20a thereof constituting the xy plane. The magnetic sensing elements R1 to R4 are not particularly limited as long as the physical properties thereof change according to a magnetic flux density, but may each preferably be a magnetic sensing element whose electric resistance changes according to the direction of a magnetic field. In the present embodiment, the sensitivity directions (fixed magnetization directions) of the respective magnetic sensing elements R1 to R4 are aligned in a direction (positive side in the x-direction) denoted by the arrow P in FIGS. 2 and 3. An insulating film 24 is formed on the element forming surface 20a and protects the magnetic sensing elements R1 to R4.

The first external magnetic member 30 is disposed on the element forming surface 20a of the sensor substrate 20. The first external magnetic member 30 is disposed between a portion where the magnetic sensing elements R1 and R3 are arranged and a portion where the magnetic sensing elements R2 and R4 are arranged in a plan view (when viewed in the z-direction) and has a rectangular parallelepiped shape elongated in the z-direction. The first external magnetic member 30 collects magnetic flux φ in the z-direction and distributes the collected magnetic flux φ to both sides in the x-direction. There is no particular restriction on the height of the first external magnetic member 30 in the z-direction; however, by increasing the height thereof, selectivity of the magnetic flux in the z-direction can be enhanced. However, in a case where the first external magnetic member 30 is directly fixed to the sensor substrate 20, when the height of the first external magnetic member 30 in the z-direction is excessively high, support for the first external magnetic member 30 may become unstable, so that it is preferable to increase the height to the extent that stable support can be ensured. In the present embodiment, the width of the first external magnetic member 30 in the y-direction substantially coincides with the width of the sensor substrate 20 in the y-direction; however, the present invention is not limited to this.

The sensor substrate 20 has first and second side surfaces 21 and 22 constituting the yz plane and a back surface 23 positioned on the opposite side of the element forming surface 20a. The first and second side surfaces 21 and 22 are each a surface perpendicular to the element forming surface 20a; however, they need not be completely perpendicular to the element forming surface 20a. The back surface 23 is a surface parallel to the element forming surface 20a; however, it need not be completely parallel to the element forming surface 20a.

The first side surface 21, second side surface 22, and back surface 23 of the sensor substrate 20 are covered with the second external magnetic member 40. More specifically, the second external magnetic member 40 has a first part 41 that covers the first side surface 21 of the sensor substrate 20, a second part 42 that covers the second side surface 22 of the sensor substrate 20, and a third part 43 that covers the back surface 23 of the sensor substrate 20, and the first to third parts 41 to 43 are integrated together. By forming the second external magnetic member 40 into an integrated block, the magnetic resistance of the second external magnetic member 40 can be minimized. The first to third parts 41 to 43 of the second external magnetic member 40 may not necessarily contact the first side surface 21, the second side surface 22 and the back surface 23 of the sensor substrate 20, respectively, that is, a space may be provided therebetween, or another member such as an adhesive may be interposed therebetween.

In the present embodiment, the width of the second external magnetic member 40 in the y-direction substantially coincides with the width of the sensor substrate 20 in the y-direction; however, the present invention is not limited to this. Further, in the present embodiment, the first and second parts 41 and 42 of the second external magnetic member 40 each have a tapered shape in which the thickness thereof in the x-direction gradually increases from the element forming surface 20a side toward the back surface 23 side. Although this is not essential in the present invention, by forming the first and second parts 41 and 42 of the second external magnetic member into such a shape, magnetism collection effect can be enhanced more than when the first and second parts 41 and 42 do not have the tapered shape.

The second external magnetic member 40 has a first overhanging part OH1 obtained by extending the first part 41 in the z-direction beyond the element forming surface 20a and then bending the extended portion to the element forming surface 20a side. Similarly, the second external magnetic member 40 has a second overhanging part OH2 obtained by extending the second part 42 in the z-direction beyond the element forming surface 20a and then bending the extended portion to the element forming surface 20a side. In the present embodiment, both the first and second overhanging parts OH1 and OH2 contact the insulating film 24 formed on the element forming surface 20a. Thus, the difference in height in the z-direction between the magnetic sensing elements R1 to R4 and the first and second overhanging parts OH1 and OH2 is minimized.

With this configuration, when viewed in the z-direction, the magnetic sensing elements R1 and R3 are positioned between the first external magnetic member 30 and the first overhanging part OH1, and the magnetic sensing elements R2 and R4 are positioned between the first external magnetic member 30 and the second overhanging part OH2. Thus, the magnetic flux φ collected by the first external magnetic member 30 is substantially equally distributed to the left and right sides as illustrated in FIG. 3 and absorbed by the second external magnetic member 40 through the first and second overhanging parts OH1 and OH2. At this time, part of the magnetic flux φ passes the magnetic sensing elements R1 to R4, so that the magnetic flux in the mutually opposite directions is given to the magnetic sensing elements R1, R3 and magnetic sensing elements R2, R4. As described above, the fixed magnetization directions of the magnetic sensing elements R1 to R4 are aligned in the positive x-direction denoted by the arrow P, so that the magnetic sensing elements R1 to R4 have sensitivity with respect to the magnetic flux component in the x-direction.

Figure 4:
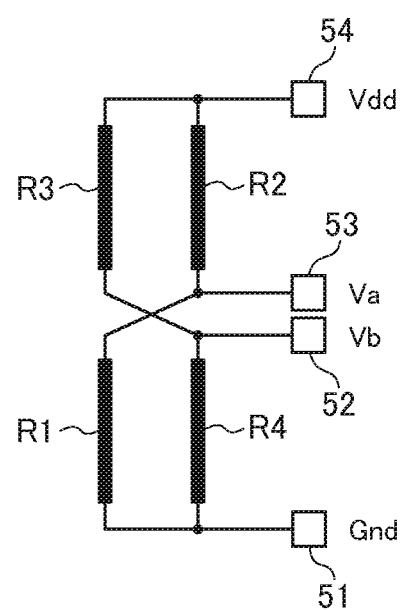
FIG. 4 is a circuit diagram for explaining the connection relationship among the magnetic sensing elements R1 to R4.

FIG. 4 is a circuit diagram for explaining the connection relationship among the magnetic sensing elements R1 to R4.

As illustrated in FIG. 4, the magnetic sensor 10A according to the present embodiment has four bonding pads 51 to 54. A ground potential Gnd and a power supply potential Vdd are supplied to the bonding pads 51 and 54, respectively. Between the bonding pads 51 and 54, the magnetic sensing elements R1 and R2 are connected in series, and the magnetic sensing elements R4 and R3 are connected in series. A connection point between the magnetic sensing elements R3 and R4 is connected to the bonding pad 52, and a connection point between the magnetic sensing elements R1 and R2 is connected to the bonding pad 53. With the above bridge connection configuration, it is possible to highly sensitively detect a change in the electric resistances of the magnetic sensing elements R1 to R4 according to a magnetic flux density by referring to a potential Va appearing at the bonding pad 53 and a potential Vb appearing at the bonding pad 52.

Specifically, since the magnetic sensing elements R1 to R4 have the same fixed magnetization direction, a difference occurs between a change in the resistance of the magnetic sensing elements R1 and R3 positioned on one side of the first external magnetic member 30 and a change in the resistance of the magnetic sensing elements R2 and R4 positioned on the other side of the first external magnetic member 30. This difference is amplified double by the differential bridge circuit illustrated in FIG. 4 and appears at the bonding pads 52 and 53. Thus, by detecting the difference between the potentials Va and Vb appearing at the bonding pads 52 and 53, it is possible to measure a magnetic flux density.

As described above, the magnetic sensor 10A according to the present embodiment has the first external magnetic member and can thus selectively detect magnetic flux in the z-direction. In addition, in the magnetic sensor 10A according to the present embodiment, the second external magnetic member 40 has the first and second overhanging parts OH1 and OH2, so that a magnetic resistance between the first and second external magnetic members 30 and 40 is reduced. This reduces leakage magnetic flux, and thus, the magnetic sensor according to the present embodiment can obtain a higher detection sensitivity than existing ones.

The following describes several modifications of the magnetic sensor 10A according to the present embodiment.

Figure 5:
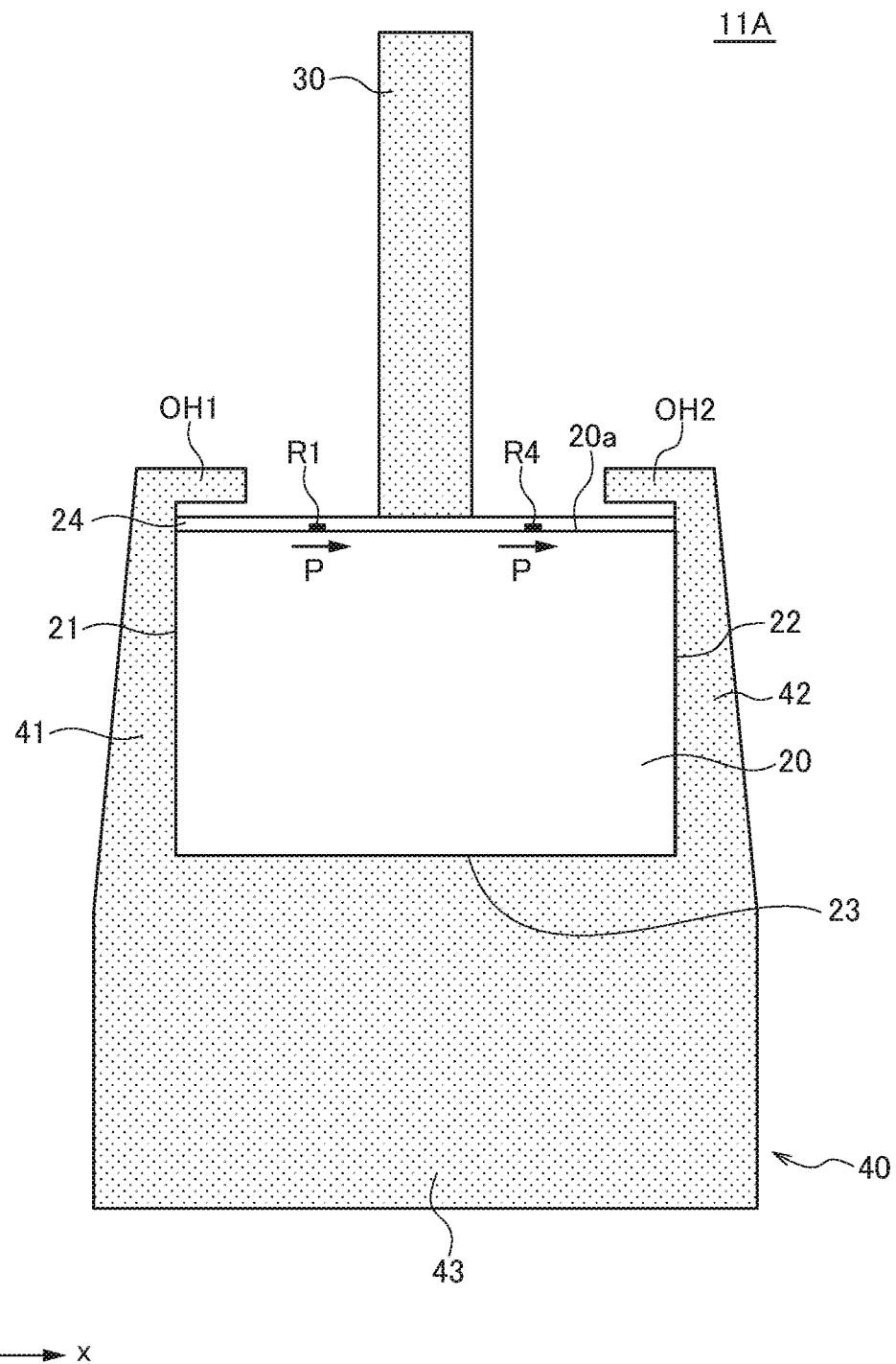
FIG. 5 is a schematic cross-sectional view illustrating the structure of a magnetic sensor 11A according to a first modification.

FIG. 5 is a schematic cross-sectional view illustrating the structure of a magnetic sensor 11A according to a first modification.

The magnetic sensor 11A illustrated in FIG. 5 differs from the magnetic sensor 10A according to the first embodiment in that the first and second overhanging parts OH1 and OH2 do not contact the insulating film 24, that is, there is a gap in the z-direction between the first and second overhanging parts OH1, OH2 and the insulating film 24. Other configurations are the same as those of the magnetic sensor 10A according to the first embodiment, so the same reference numerals are given to the same elements, and overlapping description will be omitted.

As exemplified by the magnetic sensor 11A of FIG. 5, it is not essential for the first and second overhanging parts OH1 and OH2 to contact the insulating film 24 in the present invention, but a gap may be provided therebetween. This configuration facilitates attachment of the second external magnetic member 40 to the sensor substrate 20.

Figure 6:
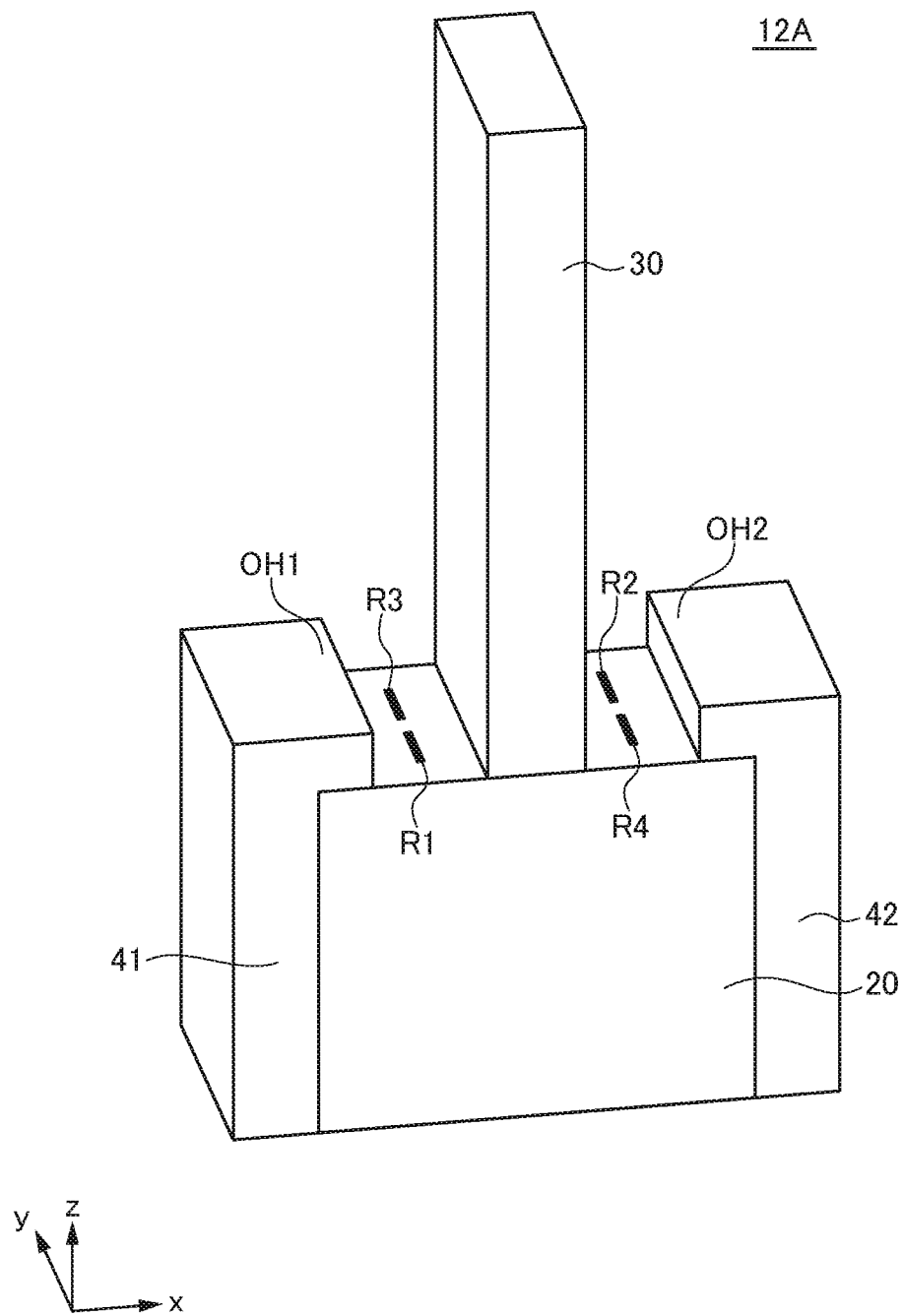
FIG. 6 is a schematic perspective view illustrating the structure of a magnetic sensor 12A according to a second modification.

FIG. 6 is a schematic perspective view illustrating the structure of a magnetic sensor 12A according to a second modification.

The magnetic sensor 12A illustrated in FIG. 6 differs from the magnetic sensor 10A according to the first embodiment in that the second external magnetic member 40 does not have the third part 43 and that the first and second parts 41 and 42 are formed separately from each other. Further, the first and second parts 41 and 42 of the second external magnetic member 40 do not have a tapered shape, but have a constant thickness in the x-direction. Other configurations are the same as those of the magnetic sensor 10A according to the first embodiment, so the same reference numerals are given to the same elements, and overlapping description will be omitted.

As exemplified by the magnetic sensor 12A of FIG. 6, it is not essential for the second external magnetic member 40 to be formed integrally in one piece, and the first and second parts 41 and 42 may be formed separately from each other. This configuration not only facilitates the manufacture of the second external magnetic member 40 but also facilitates attachment of the second external magnetic member 40 to the sensor substrate 20, improving working efficiency. Further, the back surface 23 of the sensor substrate 20 may be exposed without being covered with the second external magnetic member 40, and it is not essential for the first and second parts 41 and 42 of the second external magnetic member 40 to have a tapered shape.

Figure 7:
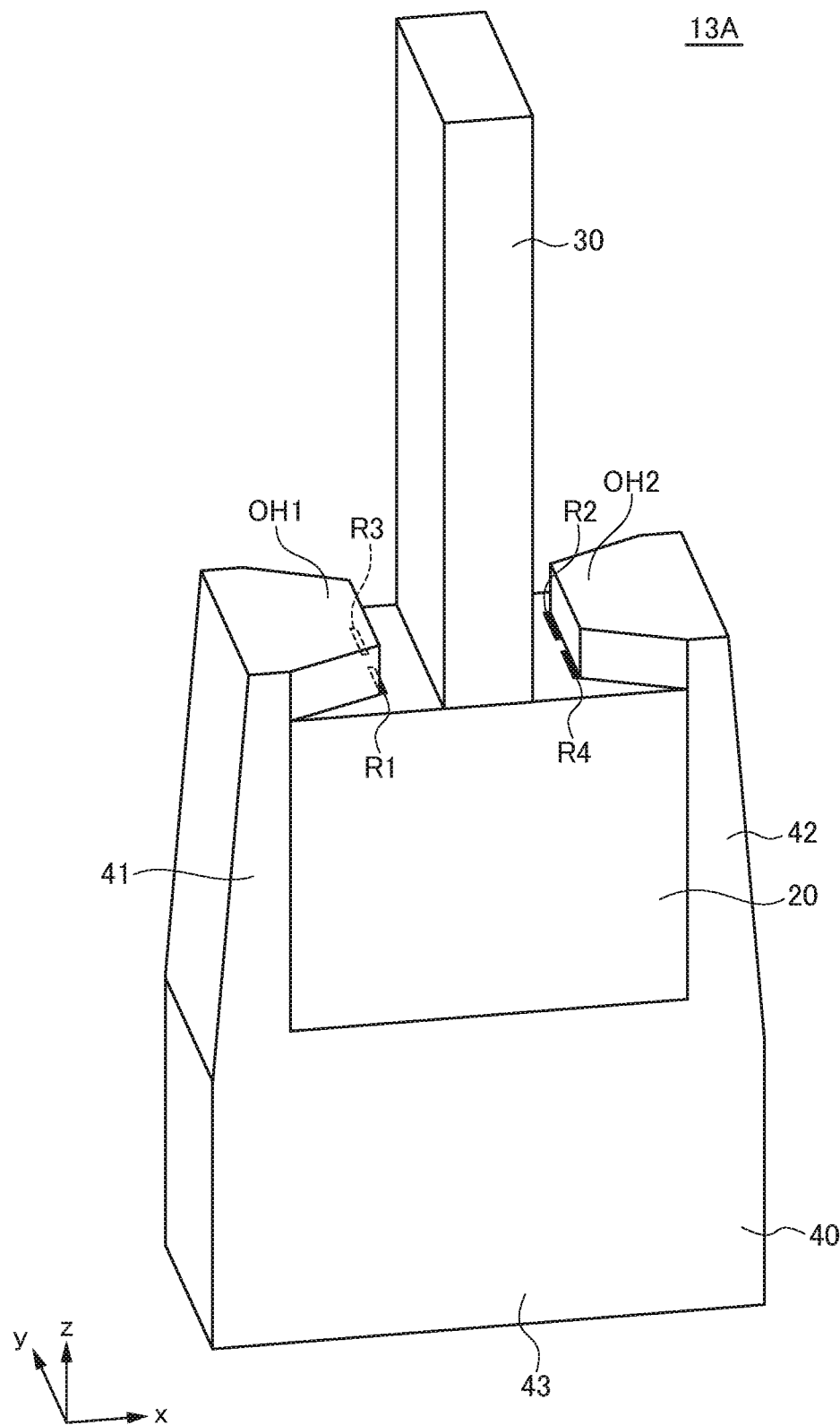
FIG. 7 is a schematic perspective view illustrating the structure of a magnetic sensor 13A according to a third modification.
Figure 8:
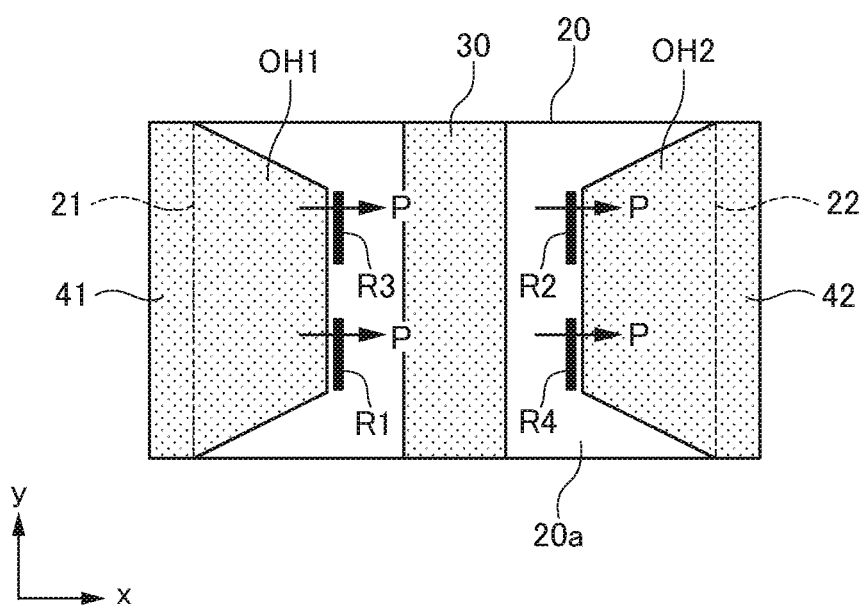
FIG. 8 is a schematic top view of the magnetic sensor 13A.

FIG. 7 is a schematic perspective view illustrating the structure of a magnetic sensor 13A according to a third modification. FIG. 8 is a schematic top view of the magnetic sensor 13A.

In the magnetic sensor 13A illustrated in FIGS. 7 and 8, the first and second overhanging parts OH1 and OH2 are gradually reduced in y-direction width as they approach the first external magnetic member 30. Further, the first and second overhanging parts OH1 and OH2 are increased in x-direction length and, thus, the end portions thereof in the x-direction are positioned near the magnetic sensing elements R1 to R4. Other configurations are the same as those of the magnetic sensor 10A according to the first embodiment, so the same reference numerals are given to the same elements, and overlapping description will be omitted.

When the first and second overhanging parts OH1 and OH2 are increased in x-direction length to be brought close to the magnetic sensing elements R1 to R4, the magnetic flux concentrates more on the magnetic sensing elements R1 to R4. On the other hand, the distance between the first and second external magnetic members 30 and 40 is reduced, so that the magnetic flux that reaches the second external magnetic member 40 directly from the first external magnetic member 30 bypassing the magnetic sensing elements R1 to R4 may be increased. When such bypassing magnetic flux is increased, detection sensitivity is deteriorated. However, in the magnetic sensor 13A of the present modification, the first and second overhanging parts OH1 and OH2 are gradually reduced in y-direction width as they approach the first external magnetic member 30, so that the bypassing magnetic flux can be reduced.

Figure 9:
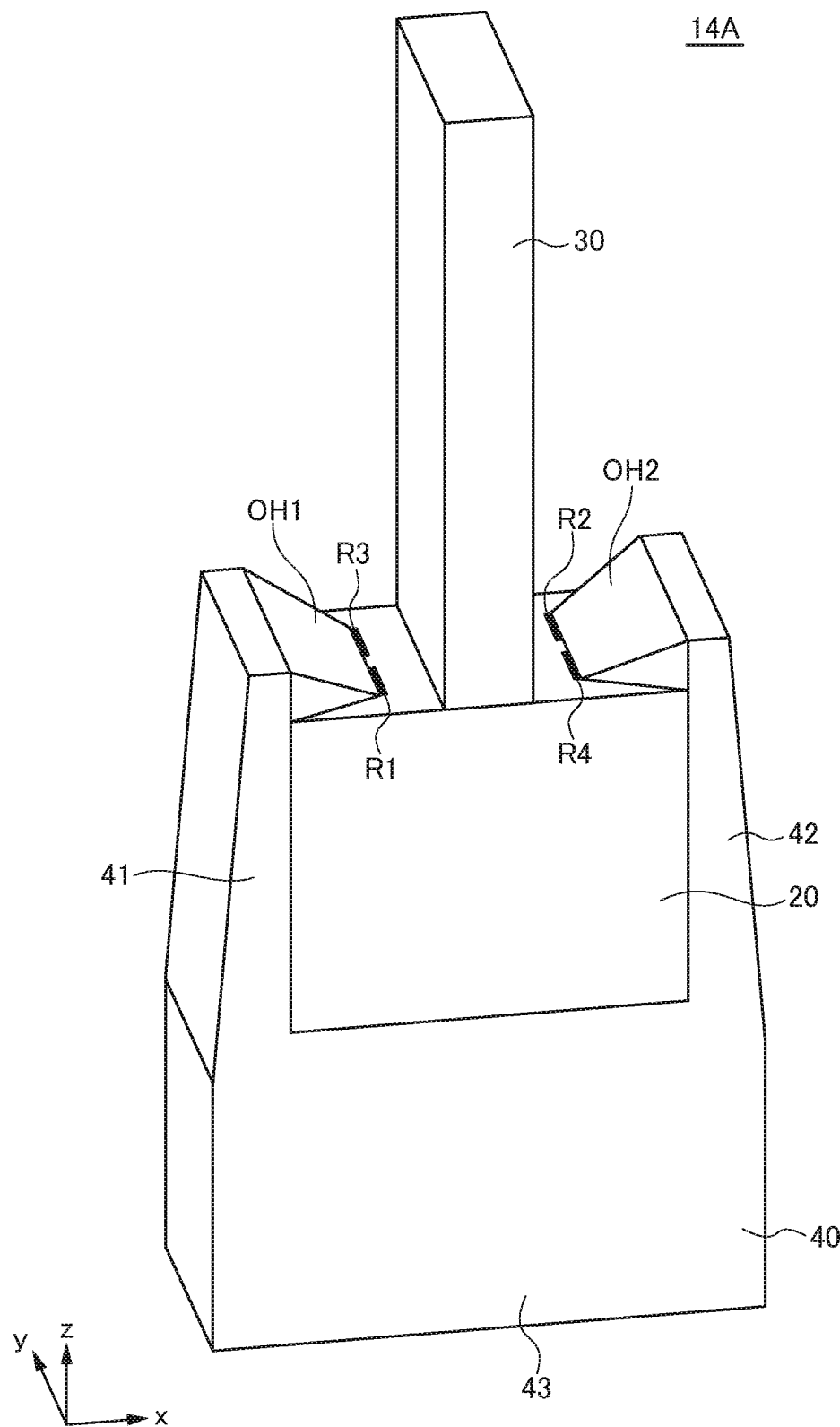
FIG. 9 is a schematic perspective view illustrating the structure of a magnetic sensor 14A according to a fourth modification.

FIG. 9 is a schematic perspective view illustrating the structure of a magnetic sensor 14A according to a fourth modification.

The magnetic sensor 14A illustrated in FIG. 9 differs from the magnetic sensor 13A according to the third modification in that the first and second overhanging parts OH1 and OH2 are gradually reduced in z-direction thickness as they approach the first external magnetic member 30. Other configurations are the same as those of the magnetic sensor 13A according to the third modification, so the same reference numerals are given to the same elements, and overlapping description will be omitted.

When the first and second overhanging parts OH1 and OH2 are gradually reduced in z-direction thickness as they approach the first external magnetic member 30 like the present modification, the bypassing magnetic flux is reduced further, whereby detection sensitivity can be further enhanced.

Second Embodiment

Figure 10:
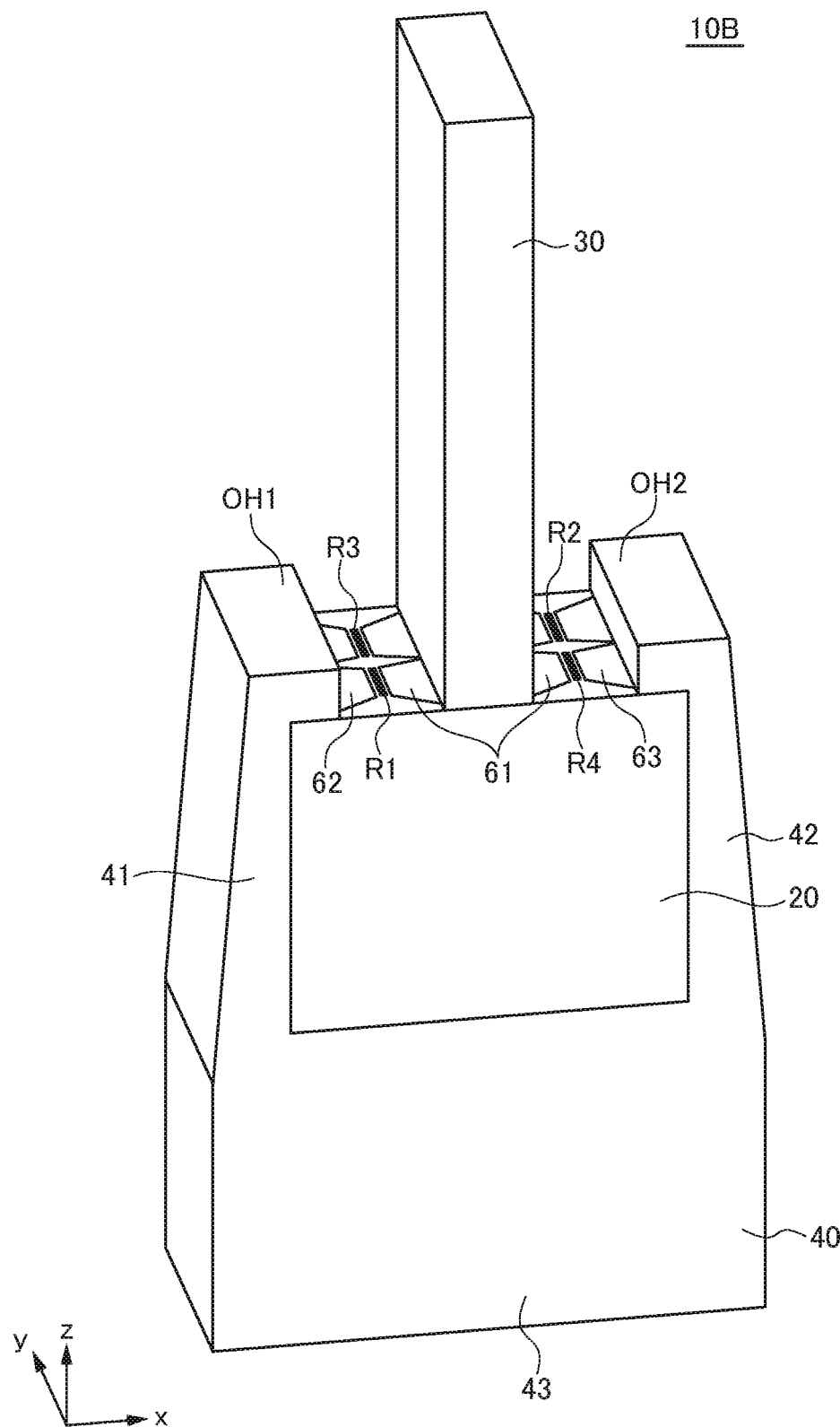
FIG. 10 is a schematic perspective view illustrating the outer appearance of a magnetic sensor 10B according to a second embodiment of the present invention.
Figure 11:
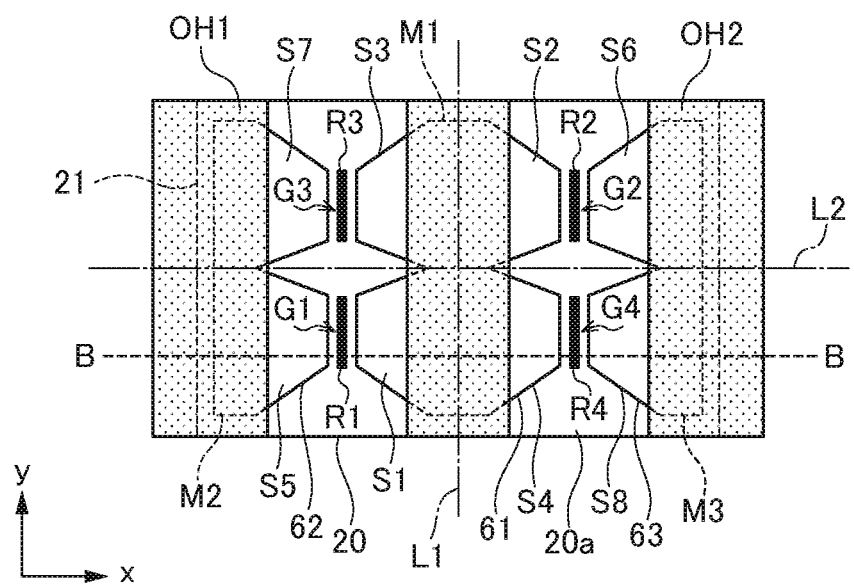
FIG. 11 is a schematic top view of the magnetic sensor 10B.

FIG. 10 is a schematic perspective view illustrating the outer appearance of a magnetic sensor 10B according to the second embodiment of the present invention. FIG. 11 is a schematic top view of the magnetic sensor 10B, and FIG. 12 is a schematic cross-sectional view taken along line B-B in FIG. 11.

Figure 12:
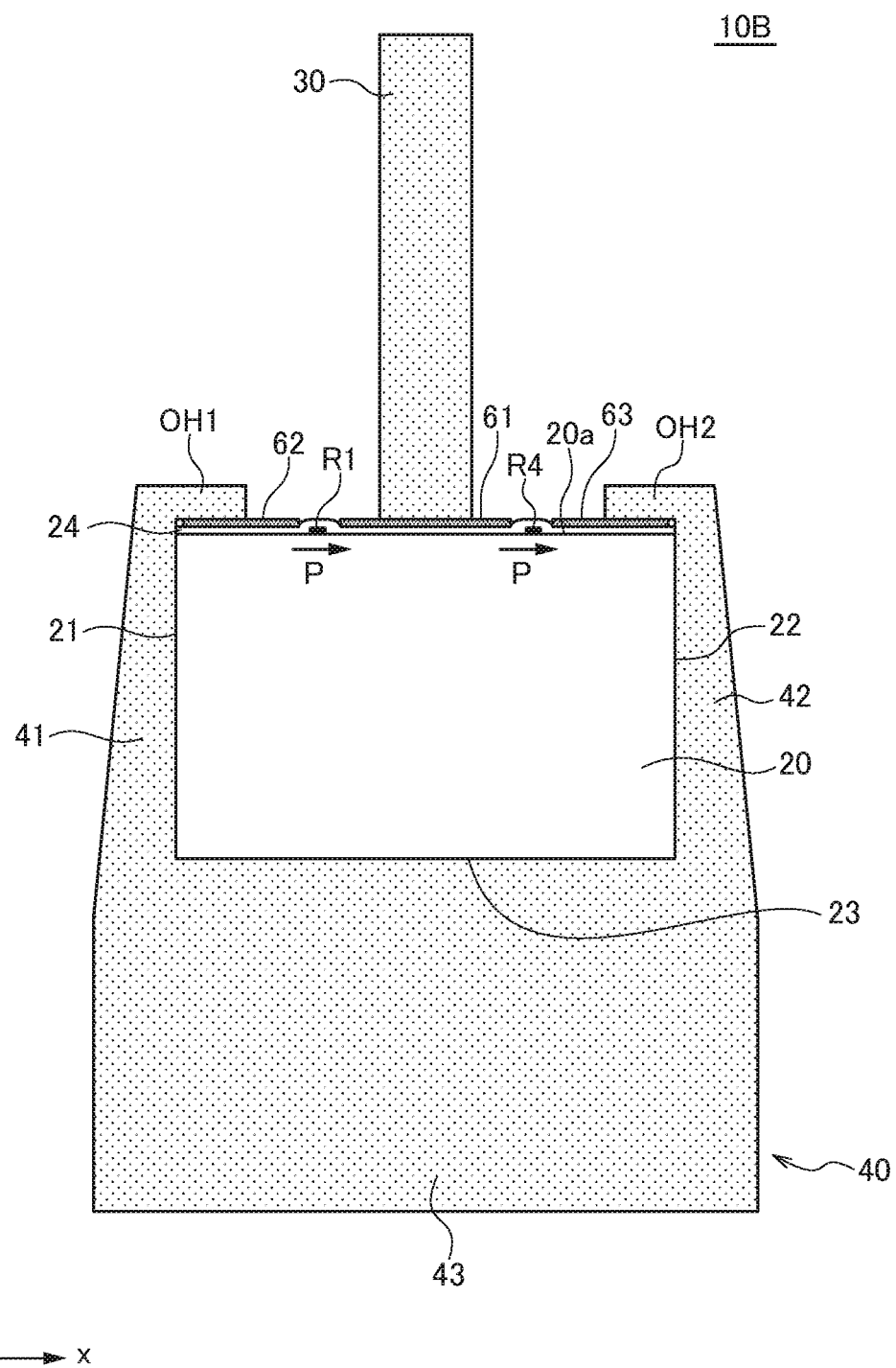
FIG. 12 is a schematic cross-sectional view taken along line B-B in FIG. 11.

As illustrated in FIGS. 10 to 12, the magnetic sensor 10B according to the present embodiment differs from the magnetic sensor 10A according to the first embodiment in that first to third magnetic layers 61 to 63 are formed on the insulating film 24 that covers the element forming surface 20a of the sensor substrate 20. Other configurations are the same as those of the magnetic sensor 10A according to the first embodiment, so the same reference numerals are given to the same elements, and overlapping description will be omitted.

The first magnetic layer 61 is positioned at substantially the center of the element forming surface 20a in a plan view, and the second and third magnetic layers 62 and 63 are disposed on both sides of the first magnetic layer 61 in the x-direction. The magnetic layers 61 to 63 may each be, but is not particularly limited to, a film made of a composite magnetic material in which magnetic filer is dispersed in a resin material, a thin film or foil made of a soft magnetic material such as nickel or permalloy, or a thin film or bulk sheet made of ferrite.

The first magnetic layer 61 includes a first main area M1 positioned at the center thereof and first to fourth converging areas S1 to S4 each having a width in the y-direction gradually reduced with increasing distance from the first main area M1 in the x-direction. The first main area M1 is a part that is covered with the first external magnetic member 30. Although not particularly limited, the width of the first external magnetic member 30 in the y-direction is preferably larger than the width of the first main area M1 in the y-direction, whereby the entire width of the first main area M1 in the y-direction is preferably covered with the first external magnetic member 30. Thus, even when displacement occurs in the positional relationship between the first external magnetic member 30 and the first main area M1 during the manufacture, detection accuracy is not significantly deteriorated. The displacement mentioned above can include rotational displacement as well as displacement in the xy direction.

As described above, the first to fourth converging areas S1 to S4 are each a taper-shaped portion having a width in the y-direction gradually reduced with increasing distance from the first main area M1 in the x-direction and, in the present embodiment, the first and third converging areas S1 and S3 are positioned on the negative x-direction side (left side) with respect to the first main area M1, and the second and fourth converging areas S2 and S4 are positioned on the positive x-direction side (right side) with respect to the first main area M1.

The first magnetic layer 61 has a dyad-symmetric shape. Thus, the first converging area S1 and the fourth converging area S4 are line-symmetric with respect to a virtual straight line L1 extending in the y-direction and, similarly, the second converging area S2 and the third converging area S3 are line-symmetric with respect to the virtual straight line L1. Further, the first converging area S1 and the third converging area S3 are line-symmetric with respect to a virtual straight line L2 extending in the x-direction and, similarly, the second converging area S2 and the fourth converging area S4 are line-symmetric with respect to the virtual straight line L2. Thus, when magnetic flux taken in through the first external magnetic member 30 enters the first main area M1, the magnetic flux is substantially equally distributed to the first to fourth converging areas S1 to S4. The distributed magnetic flux passes through the tapered, first to fourth converging areas S1 to S4 and thereby the magnetic flux density is increased.

The second magnetic layer 62 includes second main area M2 and fifth and seventh converging areas S5 and S7 each having a width in the y-direction gradually reduced with increasing distance from the second main area M2 in the x-direction (positive side). Similarly, the third magnetic layer 63 includes a third main area M3 and sixth and eighth converging areas S6 and S8 each having a width in the y-direction gradually reduced with increasing distance from the third main area M3 in the x-direction (negative side). The second main area M2 is positioned near the end portion of the sensor substrate 20 on the x-direction negative side and is covered with the first overhanging part OH1. The third main area M3 is positioned near the end portion of the sensor substrate 20 on the x-direction positive side and is covered with the second overhanging part OH2. In the present embodiment, the width of each of the first and second overhanging parts OH1 and OH2 in the y-direction is larger than the width of each of the second and third main areas M2 and M3 in the y-direction, whereby the entire width of each of the second and third main areas M2 and M3 in the y-direction is covered with the first overhanging part OH1 or second overhanging part OH2.

The leading end portion of the fifth converging area S5 faces the leading end portion of the first converging area S1 through a first gap G1. The leading end portion of the seventh converging area S7 faces the leading end portion of the third converging area S3 through a third gap G3. The fifth converging area S5 and the seventh converging area S7 are line-symmetric with respect to the virtual straight line L2 extending in the x-direction. Thus, when magnetic flux taken in through the second external magnetic member 40 enters the second main area M2 through the first overhanging part OH1, the magnetic flux is substantially evenly distributed to the fifth and seventh converging areas S5 and S7.

The leading end portion of the sixth converging area S6 faces the leading end portion of the second converging area S2 through a second gap G2. The leading end portion of the eighth converging area S8 faces the leading end portion of the fourth converging area S4 through a fourth gap G4. The sixth converging area S6 and the eighth converging area S8 are line-symmetric with respect to the virtual straight line L2 extending in the x-direction. Thus, when magnetic flux taken in through the second external magnetic member 40 enters the third main area M3 through the second overhanging part OH2, the magnetic flux is substantially evenly distributed to the sixth and eighth converging areas S6 and S8.

As illustrated in FIG. 11, the first to fourth magnetic sensing elements R1 to R4 each extending in the y-direction are disposed in the first to fourth gaps G1 to G4, respectively. The widths of the first to fourth gaps G1 to G4 in the x-direction are equal to each other. The first to fourth magnetic sensing elements R1 to R4 do not contact the first to third magnetic layers 61 to 63.

As described above, in the magnetic sensor 10B according to the present embodiment, the first to third magnetic layers 61 to 63 are formed on the element forming surface 20a of the sensor substrate 20, and the magnetic sensing elements R1 to R4 are disposed respectively in the first to fourth gaps G1 to G4 formed by the magnetic layers 61 to 63, thereby preventing magnetic flux generated by current flowing in one magnetic sensing element from affecting the other magnetic sensing element. Thus, the magnetic sensor according to the present embodiment can obtain a higher detection sensitivity than existing magnetic sensors.

In addition, the eight converging areas S1 to S8 constituting the gaps G1 to G4 have a tapered-shape having a width in the y-direction gradually reduced toward their corresponding magnetic sensing elements R1 to R4, so that the density of the magnetic flux to be given to the magnetic sensing elements R1 to R4 is increased. Further, the first main area M1 included in the first magnetic layer 61 has an area wide enough to be connected with the base portions of all the four converging areas S1 to S4, so that magnetism collection effect of the magnetic flux φ through the first external magnetic member 30 is improved, whereby high detection accuracy can be achieved.

As illustrated in FIG. 12, the insulating film 24 is interposed between the magnetic sensing elements R1 to R4 and magnetic layers 61 to 63, so that the position of the magnetic sensing elements R1 to R4 and the position of the magnetic layers 61 to 63 slightly differ in the z-direction. It follows that the magnetic sensing elements R1 to R4 are disposed slightly offset in the z-direction from the gaps formed by the magnetic layers 61 to 63; however, they are each positioned on a magnetic path formed by the existence of the gap and can thus receive the magnetic flux flowing from one magnetic layer to the other magnetic layer. Thus, the position of the magnetic resistance effect element may be slightly offset from the gap formed by two magnetic layers.

Further, a gap may be formed in the z-direction by making two magnetic layers partially overlap each other. Furthermore, a gap may be formed in the oblique direction by forming two magnetic layers on different planes such that they do not overlap each other. That is, the gap formed by two magnetic layers may be two dimensional or three dimensional. Further, the magnetic sensing element need not be positioned strictly within the gap, but may be positioned on a magnetic path formed by the existence of the gap. Further, although the magnetic layers 61 to 63 are formed above the element forming surface 20a in the example illustrated in FIG. 12, they may be formed below the element forming surface 20a or on the element forming surface 20a itself. That is, it does not matter whether the magnetic layers 61 to 63 are formed above or below the element forming surface 20a as long as the magnetic layers 61 to 63 overlap the element forming surface 20a in a plan view.

The following describes several modifications of the magnetic sensor 10B according to the present embodiment.

Figure 13:
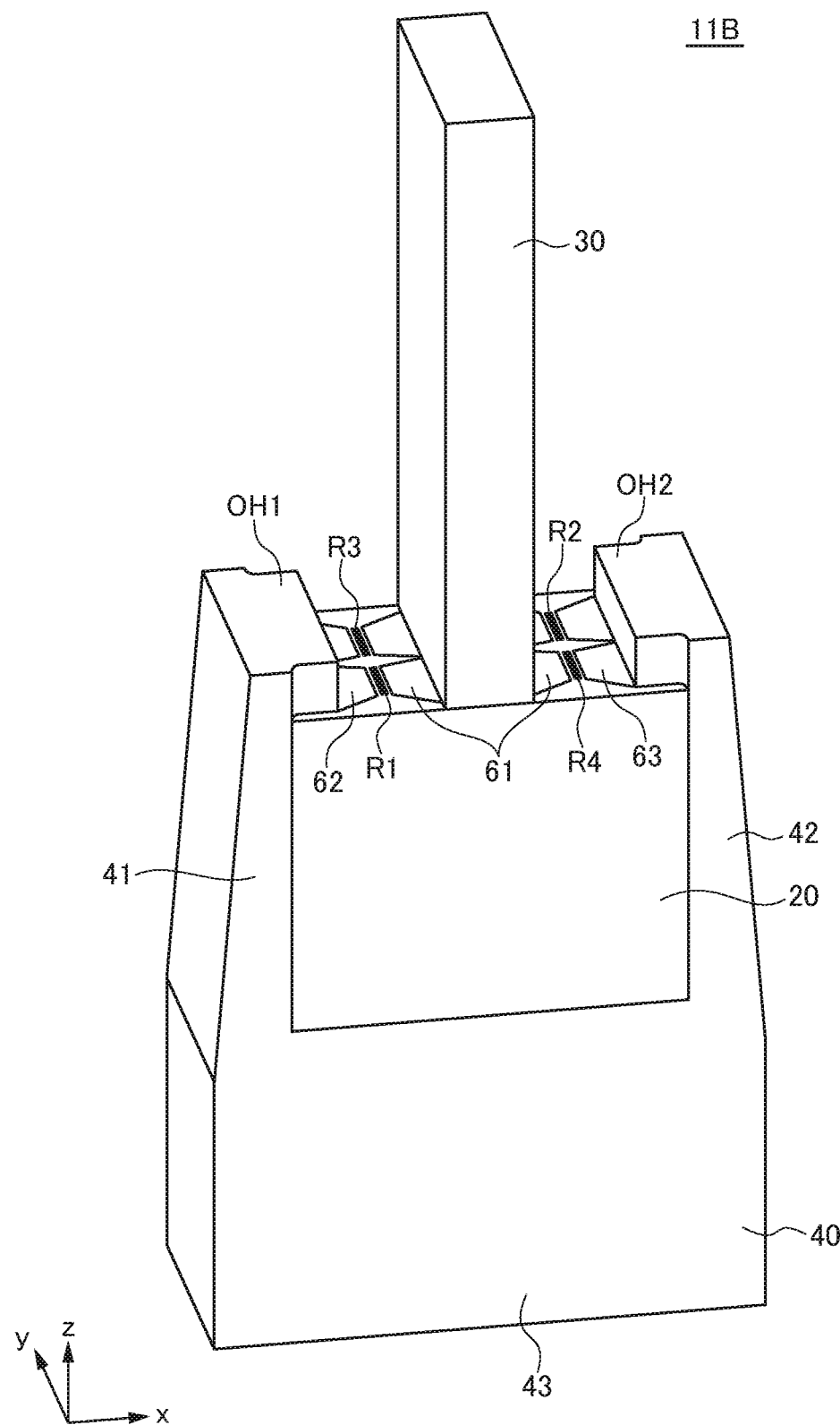
FIG. 13 is a schematic perspective view illustrating the structure of the magnetic sensor 11B according to a first modification.

FIG. 13 is a schematic perspective view illustrating the structure of the magnetic sensor 11B according to a first modification.

The magnetic sensor 11B illustrated in FIG. 13 differs from the magnetic sensor 10B according to the second embodiment in that the leading end portions of the first and second overhanging parts OH1 and OH2 are reduced in width such that the widths of the first and second overhanging parts OH1 and OH2 in the y-direction coincide respectively with the widths of the second and third main areas M2 and M3 in the y-direction.

Other configurations are the same as those of the magnetic sensor 10B according to the second embodiment, so the same reference numerals are given to the same elements, and overlapping description will be omitted.

As exemplified by the magnetic sensor 11B illustrated in FIG. 13, when the leading end portions of the first and second overhanging parts OH1 and OH2 are reduced in y-direction width, the above-described bypassing magnetic flux is reduced, making it possible to enhance detection sensitivity.

Figure 14:
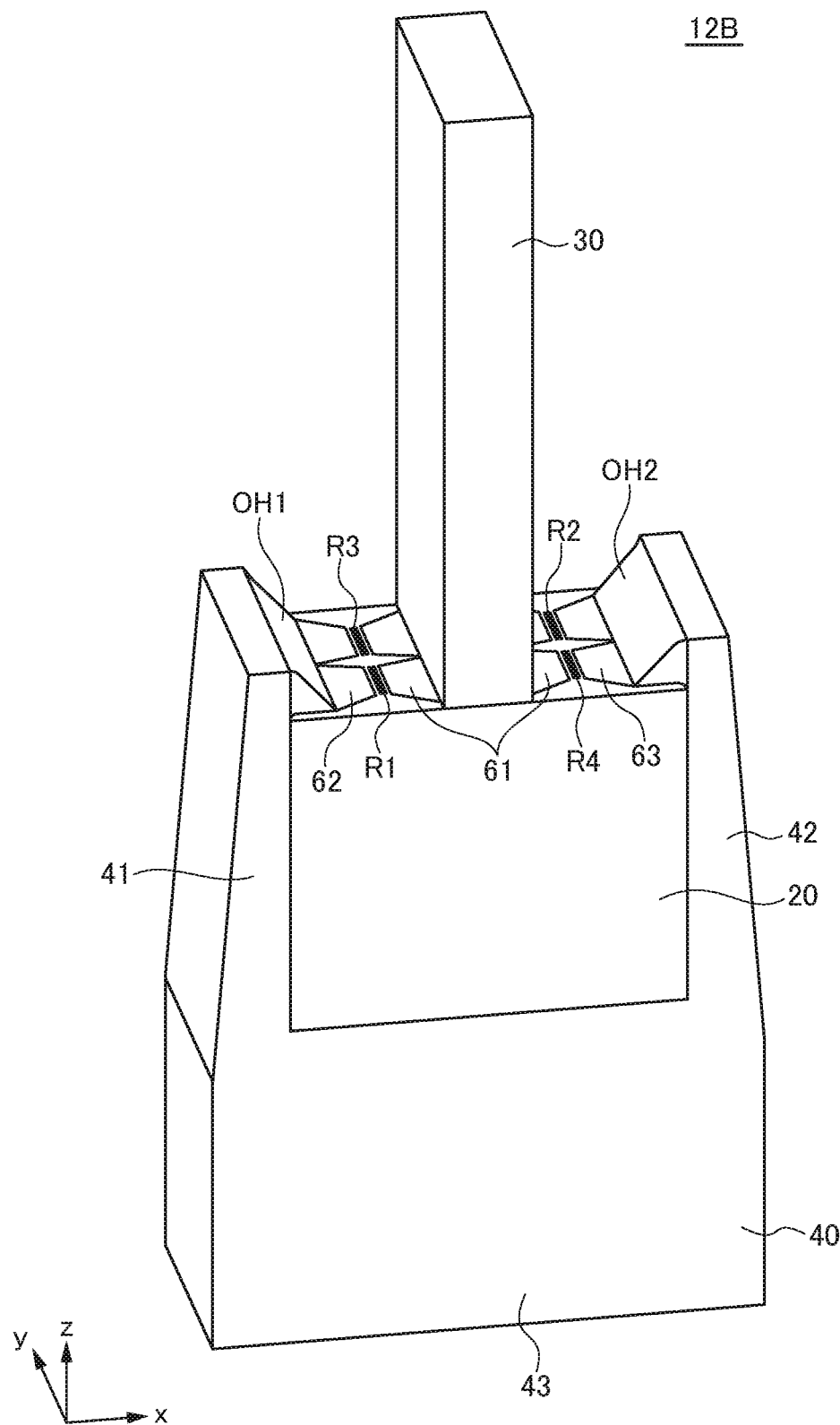
FIG. 14 is a schematic perspective view illustrating the structure of the magnetic sensor 12B according to a second modification.

FIG. 14 is a schematic perspective view illustrating the structure of the magnetic sensor 12B according to a second modification.

The magnetic sensor 12B illustrated in FIG. 14 differs from the magnetic sensor 11B according to the first modification in that the first and second overhanging parts OH1 and OH2 are gradually reduced in z-direction thickness as they approach the first external magnetic member 30. Other configurations are the same as those of the magnetic sensor 11B according to the first modification, so the same reference numerals are given to the same elements, and overlapping description will be omitted.

When the first and second overhanging parts OH1 and OH2 are gradually reduced in z-direction thickness as they approach the first external magnetic member 30 like the present modification, the bypassing magnetic flux is reduced further, whereby detection sensitivity can be further enhanced.

Figure 15:
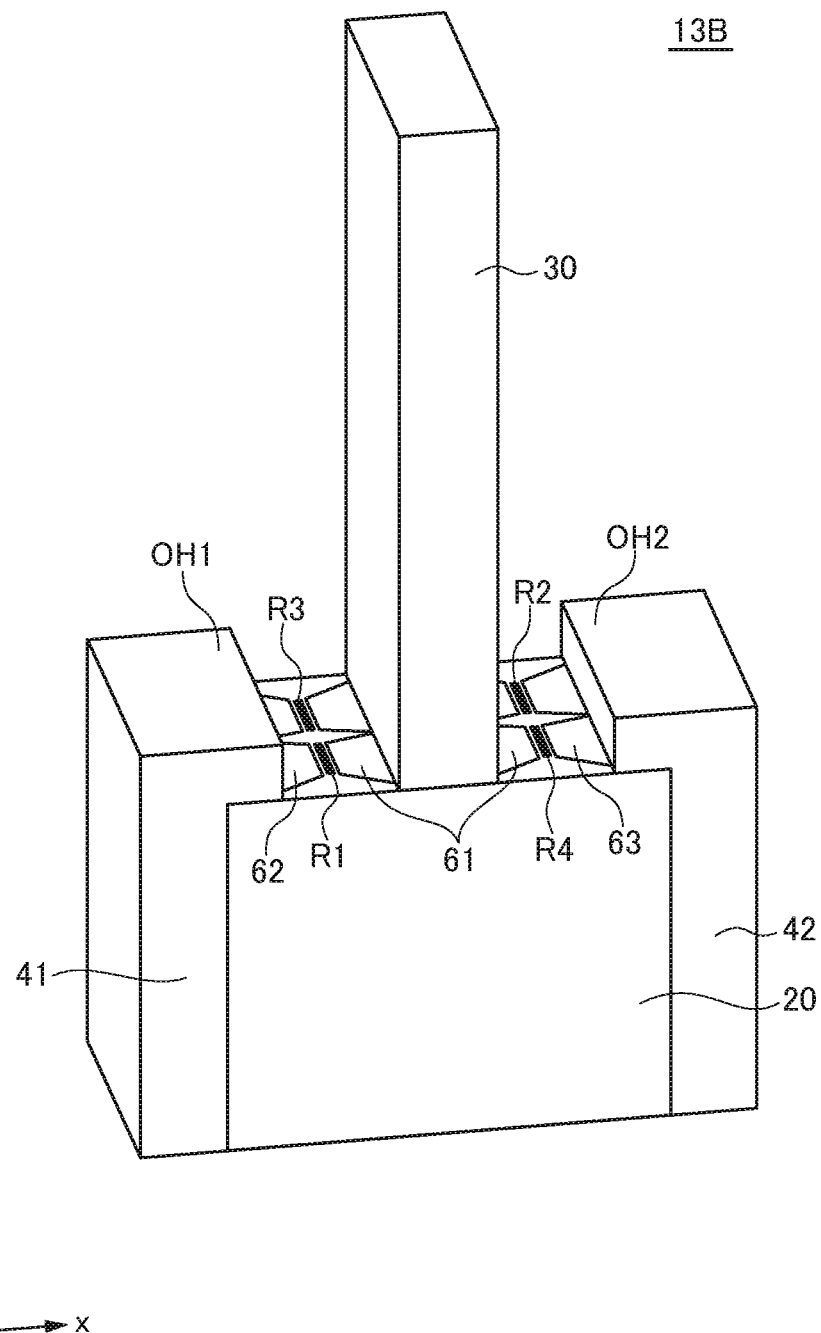
FIG. 15 is a schematic perspective view illustrating the structure of a magnetic sensor 13B according to a third modification.

FIG. 15 is a schematic perspective view illustrating the structure of a magnetic sensor 13B according to a third modification.

The magnetic sensor 13B illustrated in FIG. 15 differs from the magnetic sensor 10B according to the second embodiment in that, like the magnetic sensor 12A illustrated in FIG. 6, the second external magnetic member 40 does not have the third part 43 and that the first and second parts 41 and 42 are formed separately from each other. Further, the first and second parts 41 and 42 of the second external magnetic member 40 do not have a tapered shape, and have a substantially uniform thickness in the x-direction. Other configurations are the same as those of the magnetic sensor 10B according to the second embodiment, so the same reference numerals are given to the same elements, and overlapping description will be omitted.

As illustrated in FIG. 15, even in a configuration in which the first to third magnetic layers 61 to 63 are formed, the first and second parts 41 and 42 of the second external magnetic member 40 may be formed separately from each other, and may be formed linearly.

Third Embodiment

Figure 16:
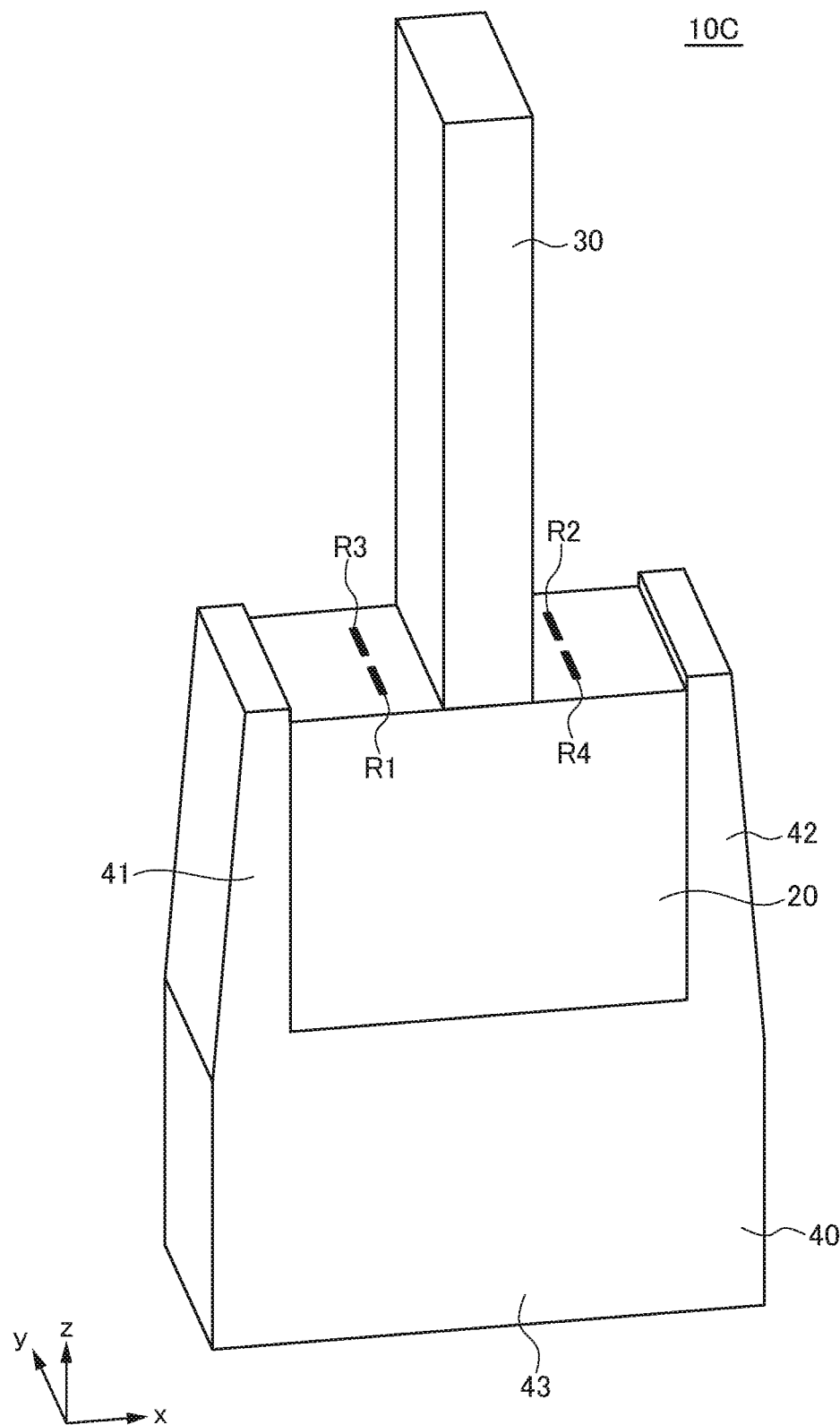
FIG. 16 is a schematic perspective view illustrating the outer appearance of a magnetic sensor 10C according to a third embodiment of the present invention.
Figure 17:
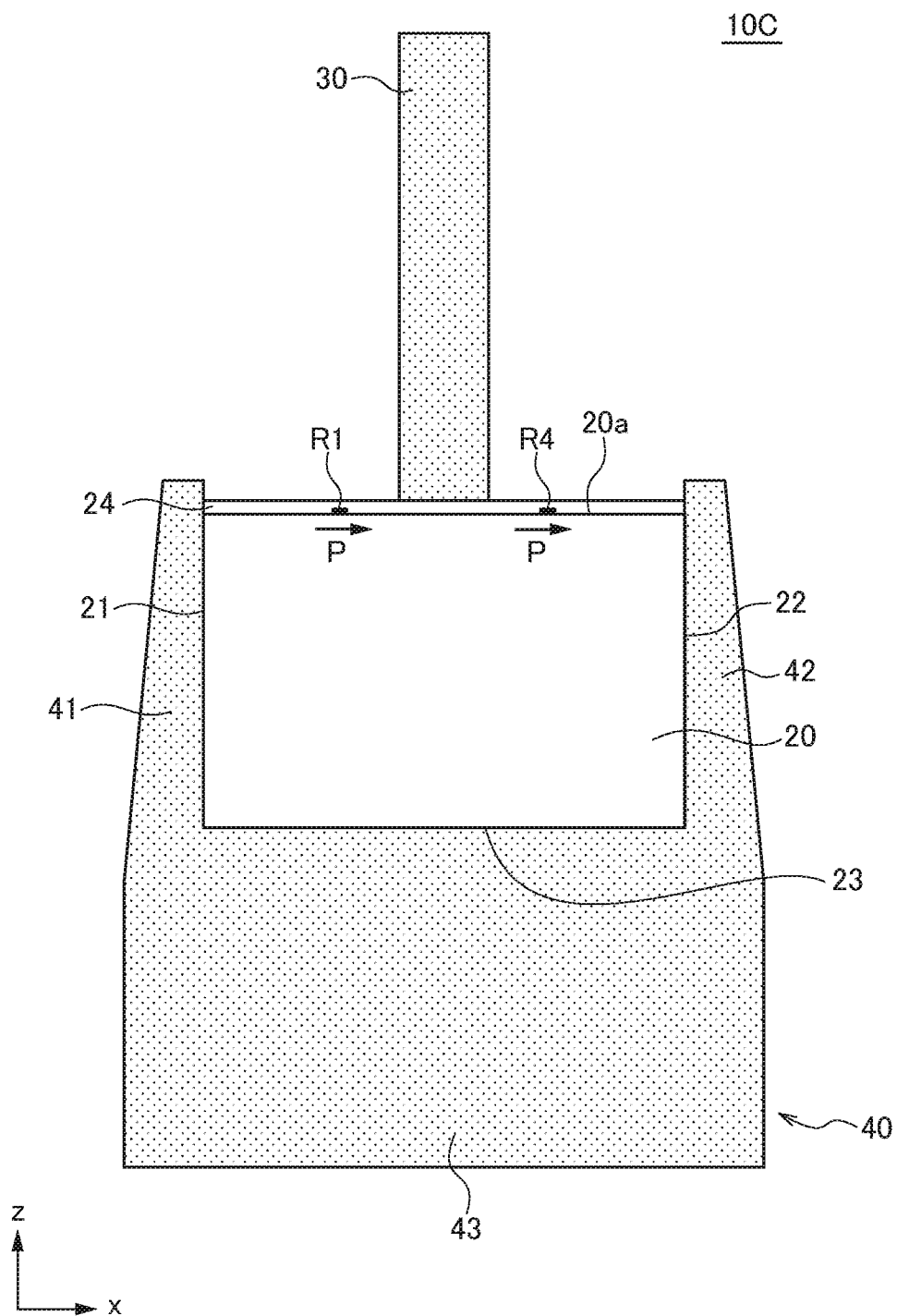
FIG. 17 is a schematic cross-sectional view of the magnetic sensor 10C.

FIG. 16 is a schematic perspective view illustrating the outer appearance of a magnetic sensor 10C according to the third embodiment of the present invention. FIG. 17 is a schematic cross-sectional view of the magnetic sensor 10C.

As illustrated in FIGS. 16 and 17, the magnetic sensor 10C according to the present embodiment differs from the magnetic sensor 10A according to the first embodiment in that the second external magnetic member 40 does not have the overhanging parts OH1 and OH2, but instead, the first and second parts 41 and 42 of the second external magnetic member 40 protrude in the z-direction from the element forming surface 20a. Other configurations are the same as those of the magnetic sensor 10A according to the first embodiment, so the same reference numerals are given to the same elements, and overlapping description will be omitted.

As described above, in the magnetic sensor 10C according to the present embodiment, the first and second parts 41 and 42 protrude in the z-direction from the element forming surface 20a, so that as compared with a case where the end portions of the first and second parts 41 and 42 in the z-direction are flush with the element forming surface 20a, a magnetic resistance between the first and second external magnetic members 30 and 40 is reduced, making it possible to obtain high detection sensitivity. Further, the shape of the second external magnetic member 40 becomes simpler, thus facilitating the manufacture and mounting of the second external magnetic member 40.

Figure 18:
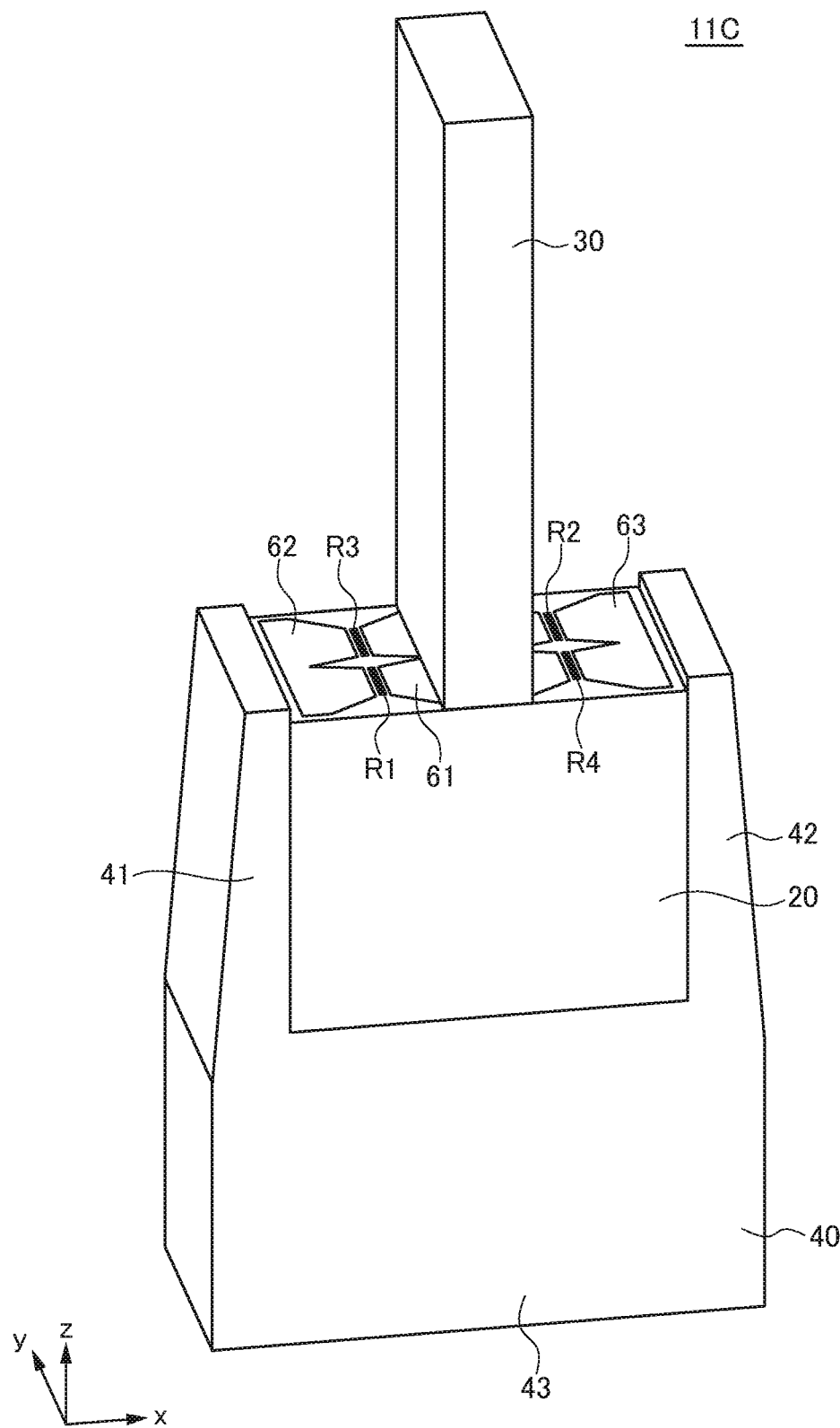
FIG. 18 is a schematic perspective view illustrating the outer appearance of the magnetic sensor 11C according to a first modification.
Figure 19:
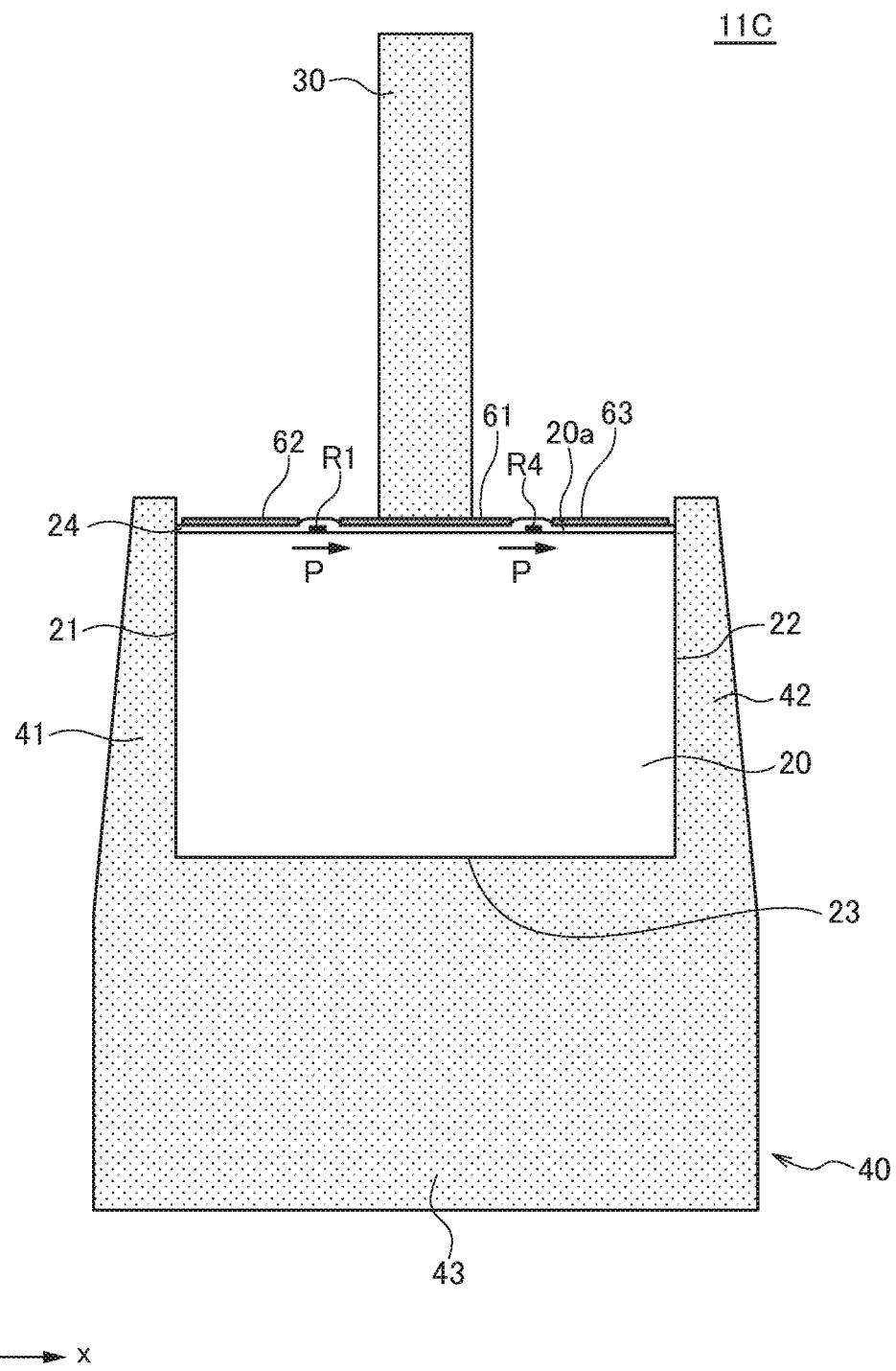
FIG. 19 is a schematic cross-sectional view of the magnetic sensor 11C.

FIG. 18 is a schematic perspective view illustrating the outer appearance of the magnetic sensor 11C according to a first modification. FIG. 19 is a schematic cross-sectional view of the magnetic sensor 11C.

The magnetic sensor 11C illustrated in FIGS. 18 and 19 differs from the above-described magnetic sensor 10C in that the first to third magnetic layers 61 to 63 are formed on the insulating film 24 that covers the element forming surface 20a of the sensor substrate 20. Other configurations are the same as those of the magnetic sensor 10C according to the third embodiment, so the same reference numerals are given to the same elements, and overlapping description will be omitted.

The material and shape of the first to third magnetic layers 61 to 63 are as described using FIG. 11. By forming the magnetic layers 61 to 63, a magnetic resistance between the first and second external magnetic members 30 and 40 is reduced further. This further reduces leakage magnetic flux, making it possible to obtain a higher detection sensitivity.

Figure 20:
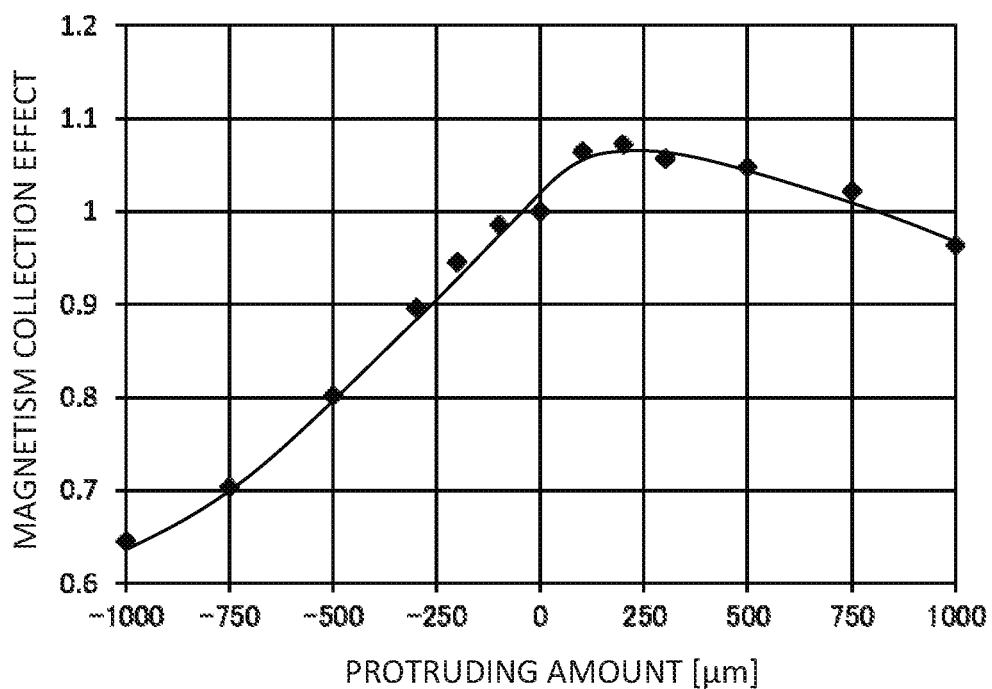
FIG. 20 is a graph illustrating the relationship between the protruding amount of the first and second parts 41, 42 and the magnetism collection effect in the magnetic sensor 10C.
Figure 21:
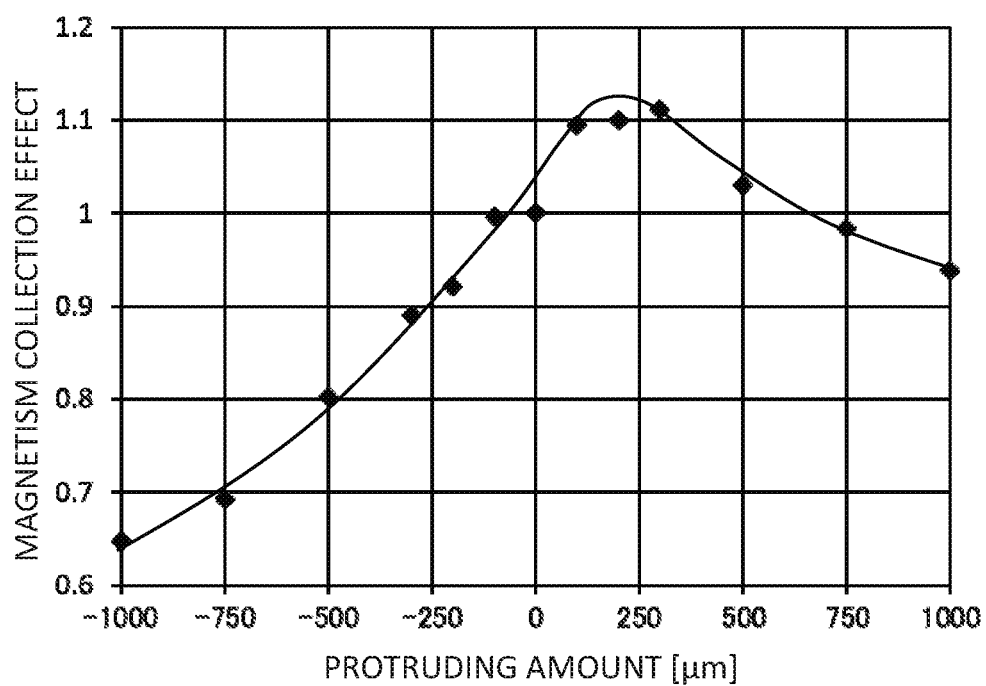
FIG. 21 is a graph illustrating the relationship between the protruding amount of the first and second parts 41, 42 and the magnetism collection effect in the magnetic sensor 11C.

FIGS. 20 and 21 are each a graph illustrating the relationship between the protruding amount of the first and second parts 41, 42 and the magnetism collection effect. FIG. 20 illustrates the characteristics of the magnetic sensor 10C (having no magnetic layer), and FIG. 21 illustrates the characteristics of the magnetic sensor 11C (having the magnetic layer). The magnetism collection effect is normalized with a case where the protruding amount is zero (that is, the end portions of the first and second parts 41 and 42 in the z-direction are flush with the element forming surface 20a) as 1. Further, in both FIGS. 20 and 21, the distance (distance along the element forming surface 20a) between the first external magnetic member 30 and each of the first and second parts 41 and 42 of the second external magnetic member 40 in the x-direction is 900 μm.

As illustrated in FIGS. 20 and 21, higher magnetism collection effect can be obtained when the first and second parts 41 and 42 protrude to some extent than when the protruding amount thereof is zero. Further, as is clear from a comparison between FIGS. 20 and 21, improvement in the magnetism collection effect brought about by the protrusion of the first and second parts 41 and 42 is more conspicuous in the magnetic sensor 11C having the magnetic layers 61 to 63.

However, excessively large protruding amount of the first and second parts 41 and 42 will only reduce the magnetism collection effect. This is because when the protruding amount of the first and second parts 41 and 42 is excessive large, the magnetic flux that reaches the second external magnetic member 40 directly from the first external magnetic member 30 bypassing the magnetic sensing elements R1 to R4 is increased. In the example of FIG. 20, when the protruding amount of the first and second parts 41 and 42 exceeds the distance (900 μm) between the first external magnetic member 30 and each of the first and second parts 41 and 42 of the second external magnetic member 40 in the x-direction, the magnetism collection effect is lowered as compared to when the protruding amount is zero. Considering this, the protruding amount of the first and second parts 41 and 42 from the element forming surface 20a is preferably designed to be equal to or less than the distance between the first external magnetic member 30 and each of the first and second parts 41 and 42 of the second external magnetic member 40 in the x-direction.

Figure 22:
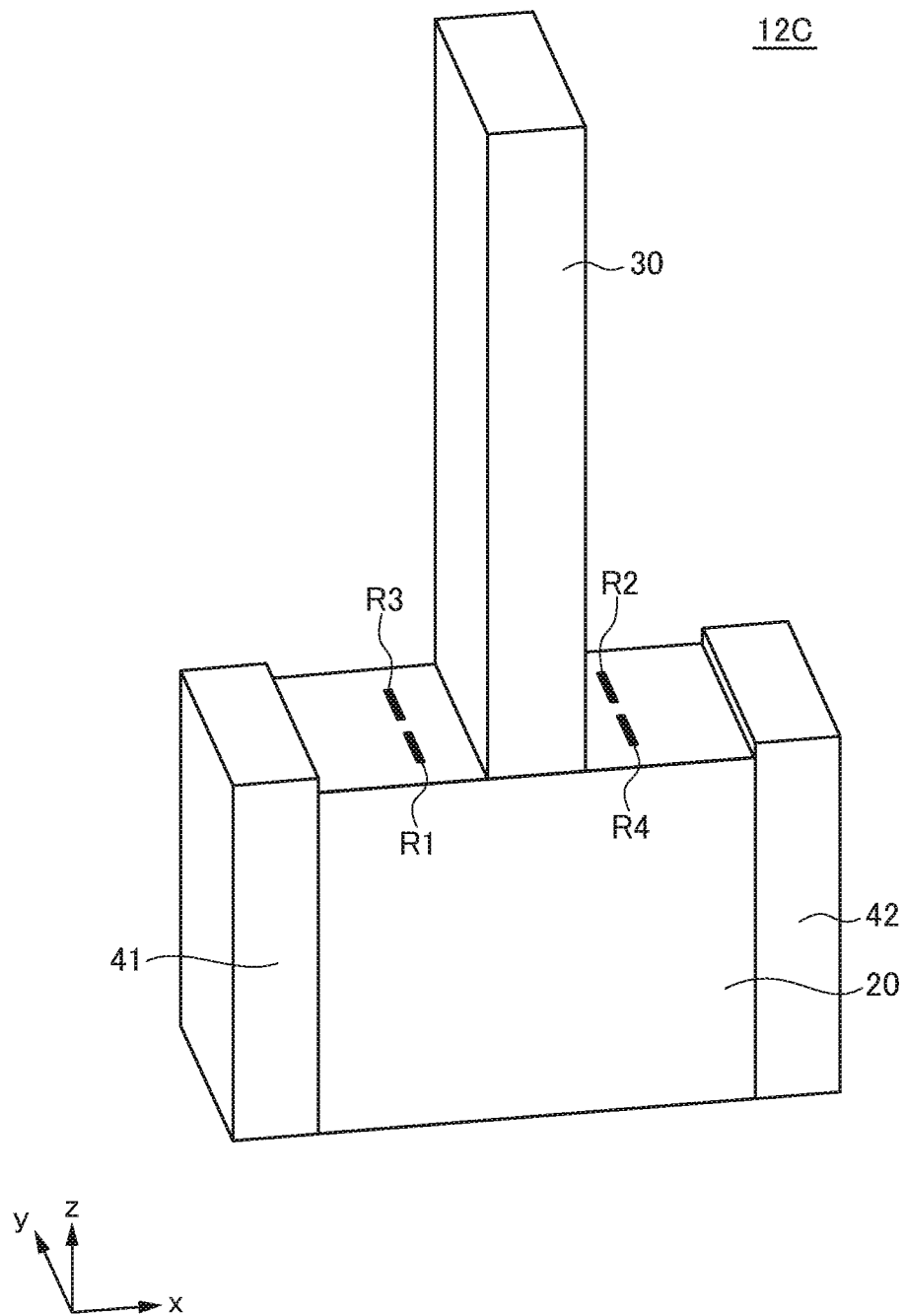
FIG. 22 is a schematic perspective view illustrating the structure of a magnetic sensor 12C according to a second modification.

FIG. 22 is a schematic perspective view illustrating the structure of a magnetic sensor 12C according to a second modification.

The magnetic sensor 12C illustrated in FIG. 22 differs from the magnetic sensor 10C according to the third embodiment in that, like the magnetic sensor 12A illustrated in FIG. 6, the second external magnetic member 40 does not have the third part 43 and that the first and second parts 41 and 42 are formed separately from each other. Further, the first and second parts 41 and 42 of the second external magnetic member 40 do not have a tapered shape, but have a substantially uniform thickness in the x-direction. Other configurations are the same as those of the magnetic sensor 10C according to the third embodiment, so the same reference numerals are given to the same elements, and overlapping description will be omitted.

As illustrated in FIG. 22, even in a configuration in which the second external magnetic member 40 does not have the overhanging parts OH1 and OH2, the first and second parts 41 and 42 of the second external magnetic member 40 may be formed separately from each other, and may be formed linearly.

It is apparent that the present invention is not limited to the above embodiments, but may be modified and changed without departing from the scope and spirit of the invention.

REFERENCE SIGNS LIST 10A-14A, 10B-13B, 10C-12C magnetic sensor
20 sensor substrate
20a element forming surface
21 first side surface
22 second side surface
23 back surface
24 insulating film
30 first external magnetic member
40 second external magnetic member
41 first part
42 second part
43 third part
51-54 bonding pad
61 first magnetic layer
62 second magnetic layer
63 third magnetic layer
G1-G4 gap
M1-M3 main area
OH1 first overhanging part
OH2 second overhanging part
R1-R4 magnetic sensing element
S1-S8 converging area
ϕ magnetic flux

What is claimed is:
1. A magnetic sensor comprising:
a sensor substrate having an element forming surface on which a plurality of magnetic sensing elements including first and second magnetic sensing elements arranged in a first direction are formed, a back surface positioned on an opposite side of the element forming surface, and first and second side surfaces substantially perpendicular to the element forming surface and the back surface and positioned opposite to each other;
a first external magnetic member provided on the element forming surface and disposed between the first and second magnetic sensing elements in a plan view; and
a second external magnetic member having a first part covering the first side surface and a second part covering the second side surface,
wherein the first magnetic sensing element is positioned between the first external magnetic member and the first part of the second external magnetic member in a plan view,
wherein the second magnetic sensing element is positioned between the first external magnetic member and the second part of the second external magnetic member in a plan view,
wherein the first part of the second external magnetic member has a first protruding part protruding beyond the element forming surface toward a side where the first external magnetic member is disposed, the first protruding part being disposed on the side, relative to the element forming surface,
wherein the second part of the second external magnetic member has a second protruding part protruding beyond the element forming surface toward the side where the first external magnetic member is disposed, the second protruding part being disposed on the side, relative to the element forming surface, wherein the first protruding part has a first overhanging part extending toward the first external magnetic member to cover the element forming surface, and wherein the second protruding part has a second overhanging part extending toward the first external magnetic member to cover the element forming surface.

2. The magnetic sensor as claimed in claim 1, wherein a protruding amount of each of the first protruding part and the second protruding part from the element forming surface is equal to or less than a distance between the first external magnetic member and each of the first protruding part and the second protruding part in the first direction along the element forming surface.

3. The magnetic sensor as claimed in claim 1, wherein each of the first and second parts of the second external magnetic member has a tapered shape in which a thickness thereof gradually increases from an element forming surface side toward a back surface side.

4. The magnetic sensor as claimed in claim 1, wherein the second external magnetic member further has a third part that covers the back surface.

5. The magnetic sensor as claimed in claim 1, wherein the first and second parts of the second external magnetic member are formed separately from each other so that the back surface of the sensor substrate is exposed without being covered with the second external magnetic member.

6. The magnetic sensor as claimed in claim 1, wherein each of the first and second overhanging parts has a shape in which a width thereof is reduced toward the first external magnetic member.

7. The magnetic sensor as claimed in claim 1, wherein each of the first and second overhanging parts has a shape in which a thickness thereof is reduced toward the first external magnetic member.

8. The magnetic sensor as claimed in claim 1, further comprising first, second and third magnetic films formed so as to overlap the element forming surface of the sensor substrate in a plan view, wherein the first magnetic sensing element is provided on a magnetic path formed by a first gap between the first and second magnetic films, wherein the second magnetic sensing element is provided on a magnetic path formed by a second gap between the first and third magnetic films, and wherein the first external magnetic member is provided on the first magnetic film.

9. The magnetic sensor as claimed in claim 8, wherein the first overhanging part covers at least a part of the second magnetic film, and the second overhanging part covers at least a part of the third magnetic film.

10. The magnetic sensor as claimed in claim 2, wherein each of the first and second parts of the second external magnetic member has a tapered shape in which a thickness thereof gradually increases from an element forming surface side toward a back surface side.

11. The magnetic sensor as claimed in claim 6, wherein each of the first and second overhanging parts has a shape in which a thickness thereof is reduced toward the first external magnetic member.

* * * * *